(12) United States Patent
Hackenberger et al.

(10) Patent No.: US 9,673,380 B2
(45) Date of Patent: Jun. 6, 2017

(54) TEMPERATURE AND FIELD STABLE RELAXOR-PT PIEZOELECTRIC SINGLE CRYSTALS

(71) Applicants: Wesley S. Hackenberger, State College, PA (US); Jun Luo, State College, PA (US); Shujun Zhang, State College, PA (US); Fei Li, State College, PA (US); Thomas R. Shrout, Pennsylvania Furnance, PA (US); Kevin A. Snook, State College, PA (US); Raffi Sahul, State College, PA (US)

(72) Inventors: Wesley S. Hackenberger, State College, PA (US); Jun Luo, State College, PA (US); Shujun Zhang, State College, PA (US); Fei Li, State College, PA (US); Thomas R. Shrout, Pennsylvania Furnance, PA (US); Kevin A. Snook, State College, PA (US); Raffi Sahul, State College, PA (US)

(*) Notice: Subject to any disclaimer, the term of this patent is extended or adjusted under 35 U.S.C. 154(b) by 0 days.

(21) Appl. No.: 14/551,513

(22) Filed: Nov. 24, 2014

(65) Prior Publication Data
US 2015/0076391 A1    Mar. 19, 2015

Related U.S. Application Data

(62) Division of application No. 13/206,971, filed on Aug. 10, 2011, now Pat. No. 8,907,546.
(Continued)

(51) Int. Cl.
*H01L 41/18* (2006.01)
*H01L 41/187* (2006.01)
(Continued)

(52) U.S. Cl.
CPC .......... *H01L 41/1875* (2013.01); *C30B 11/00* (2013.01); *C30B 29/30* (2013.01);
(Continued)

(58) Field of Classification Search
CPC ........................... H01L 41/1875; H01L 41/18
(Continued)

(56) References Cited

U.S. PATENT DOCUMENTS 5,402,791 A    4/1995  Saitoh et al.
5,804,907 A    9/1998  Park et al.
(Continued)

OTHER PUBLICATIONS

[Electromechanical characterization of [Pb (In1/2Nb1/2) O3—Pb (Mg1/3Nb2/3)O3—PbTiO3 ] crystals as a function of crystallographic orientation and temperature. [ by Shujun Zhang, Jun Luo, Wesley Hackenberger, Nevin P. Sherlock, Richard J. Meyer Jr., and Thomas R. Shrout ] Journal of Applied Physics 105, 104506 -1-5; May 22, 2009].*
(Continued)

*Primary Examiner* — Thomas Dougherty
*Assistant Examiner* — Karen B Addison
(74) *Attorney, Agent, or Firm* — McNees Wallace & Nurick LLC

(57) ABSTRACT

The application is directed to piezoelectric single crystals having shear piezoelectric coefficients with enhanced temperature and/or electric field stability. These piezoelectric single crystal may be used, among other things, for vibration sensors as well as low frequency, compact sonar transducers with improved and/or enhanced performance.

11 Claims, 20 Drawing Sheets

Related U.S. Application Data

(60) Provisional application No. 61/372,439, filed on Aug. 10, 2010.

(51) Int. Cl.
　　*C30B 11/00*　　(2006.01)
　　*C30B 29/30*　　(2006.01)
　　*C30B 29/32*　　(2006.01)
　　*C30B 33/04*　　(2006.01)

(52) U.S. Cl.
　　CPC .............. *C30B 29/32* (2013.01); *C30B 33/04* (2013.01); *H01L 41/18* (2013.01)

(58) Field of Classification Search
　　USPC .................. 310/356, 363, 364, 365, 358; 252/62.9 PZ; 501/134, 135
　　See application file for complete search history.

(56) References Cited

U.S. PATENT DOCUMENTS

| | | | |
|---|---|---|---|
| 5,998,910 | A | 12/1999 | Park et al. |
| 6,020,675 | A | 2/2000 | Yamashita et al. |
| 6,048,394 | A * | 4/2000 | Harmer ..................... C30B 9/00 117/2 |
| 6,153,967 | A | 11/2000 | Kobayashi et al. |
| 6,238,481 | B1 | 5/2001 | Yamashita et al. |
| 6,465,937 | B1 * | 10/2002 | Chen ................... H01L 41/1875 310/360 |
| 6,545,387 | B2 | 4/2003 | Lee et al. |
| 6,756,238 | B2 | 6/2004 | Ogawa et al. |
| 6,899,761 | B2 | 5/2005 | Eissler |
| 6,942,730 | B2 | 9/2005 | Han |
| 7,015,628 | B2 | 3/2006 | Matsushita et al. |
| 7,066,026 | B2 | 6/2006 | Deng |
| 7,208,041 | B2 | 4/2007 | Lee et al. |
| 7,402,938 | B2 * | 7/2008 | Matsushita ......... H01L 41/1875 252/62.9 PZ |
| 7,518,292 | B2 | 4/2009 | Matsushita et al. |
| 7,521,844 | B2 * | 4/2009 | Matsushita ......... H01L 41/1875 310/358 |
| 7,888,848 | B2 | 2/2011 | Matsushita |
| 7,908,722 | B2 | 3/2011 | Han |
| 7,972,527 | B2 | 7/2011 | Luo et al. |
| 8,004,164 | B2 | 8/2011 | Matsushita |
| 8,119,022 | B2 | 2/2012 | Lee et al. |
| 8,119,024 | B1 | 2/2012 | Matsushita |
| 8,202,364 | B2 | 6/2012 | Lee et al. |
| 8,241,519 | B2 | 8/2012 | Luo et al. |
| 2006/0091353 | A1 | 5/2006 | Matsushita et al. |
| 2007/0034141 | A1 | 2/2007 | Han |
| 2007/0090728 | A1 | 4/2007 | Matsuda et al. |
| 2007/0267947 | A1 | 11/2007 | Matsushita et al. |
| 2009/0179525 | A1 | 7/2009 | Han |
| 2009/0194732 | A1 | 8/2009 | Luo et al. |
| 2011/0017937 | A1 | 1/2011 | Hackenberger et al. |

OTHER PUBLICATIONS

S.E. Park and T. R. Shrout, :Ultrahigh strain and piezoelectric behavior in relaxor based ferroelectric single crystals, J. Appl. Phys. 82, 1804 (1997).

S. J. Zhang, R. E. Eitel, C. A. Randall and T. R. Shrout, "Manganese modified BiScO3—PbTiO3 piezoelectric ceramic for high temperature shear mode sensor," Appl. Phys. Lett. 86 (2005) 262904.

S. J. Zhang, L. Lebrun, S. F. Liu, S. Rhee, C. A. Randall and T. R. Shrout, "Piezoelectric shear coefficients of Pb(Zn1/3Nb2/3)O3—PbTiO3 single crystals," Jpn. J. Appl. Phys., 41 (2002) L1099-1102.

S. J. Zhang, L. Lebrun, S. Rhee, C. A. Randall and T. R. Shrout, "Shear mode piezoelectric properties of Pb (Yb1/2Nb1/2)O3—PbTiO3 single crystals," Appl. Phys. Lett., 81 (2002) 892-894.

X. Z. Liu, S. J. Zhang, J. Luo, T. R. Shrout and W. W. Cao, "A complete set of material properties of single domain 0.26Pb(In1/2Nb1/2)O3—0.46Pb(Mg1/3Nb2/3)O3—0.28PbTiO3 single crystals," Appl. Phys. Lett., 96 (2010) 012907.

R. Zhang, B. Jiang and W. W. Cao, "Single-domain properties of 0.67Pb(Mg1/3Nb2/3)O3—0.33PbTiO3 single crystals under electric field bias," Appl. Phys. Lett., 82 (2003) 787-789.

J. Peng, J. Z. Chen, H. S. Luo, T. H. He, H. Q. Xu and D. Lin, "Shear mode piezoelectric properties of 0.69Pb (Mg1/3Nb2/3)O3—0.31PbTiO3 single crystals," Solid State Communications, 130 (2004) 53-57.

P. D. Han, W. L. Yan, J. Tian, X. L. Huang and H. X. Pan, "Cut directions for the optimization of piezoelectric coefficients of lead magnesium niobate-lead titanate ferroelectric crystals," Appl. Phys. Lett., 86 (2005) 052902.

M. Davis, M. Budimir, D. Damjanovic, N. Setter, "Rotator and extender ferroelectrics: importance of the shear coefficient to the piezoelectric properties of domain engineered crystals and ceramics," J. Appl. Phys., 101, 054112 (2007).

Laihui Luo, Dan Zhou, Yanxue Tang, Yanmin Jia, Haiqing Xu, and Haosu Luo, "Effects of Mn doping on dielectric and piezoelectric properties of 0.71 Pb(M91/3Nb2/3)03—0.29PbTi03 single crystals," Appl. Phys. Lett., 90 (2007) 102907.

Fei Li, Shujun Zhang, Zhuo Xu, Xiaoyong Wei, Jun Luo,and Thomas R. Shrout, "Temperature independent shear piezoelectric response in relaxor-PbTiO3 based crystals," Appl. Phys. Lett., 97 (2010) 252903.

Shujun Zhang, Fei Li, Jun Luo, Ru Xia, Wesley Hackenberger, and Thomas R. Shrout, "Field Stability of Piezoelectric Shear Properties in PIN-PMN-PT Crystals Under Large Drive Field," IEEE Transactions on Ultrasonics, Ferroelectrics, and Frequency Control, vol. 58, No. 2, Feb. 2011.

Yu Lu, D., Jeong, Z., Cheng and Zhang, Q., Phase Transitional Behavior and Piezoelectric Properties of the Orthorhombic Phase of Pb (Mg1/3 Nb2/3)O3—PbTiO3 Single Crystals, Applied Physics Letters, May 14, 2001, pp. 3109-3111, vol. 78, No. 20, American Institute of Physics, Melville, New York.

Peng, Jue, Luo, Hao-Su, Lin, Di, Xu, Hai-Qing, He, Tian-Hou, and Jin, Wei-Qing, Orientation Dependence of Transverse Piezoelectric Properties of 0.70Pb (Mg 1/3 Nb2/3)O3—0.30PbTi03 Single Crystals, Applied Physics Letters, Dec. 20, 2004, pp. 6221-6223, vol. 85, No. 25, American Institute of Physics, Melville, New York.

T.R. Shrout, et al., Dielectric Behavior of Single Crystals Near the(1-x) Pb(Mg1/3Nb2/3)O3—(x) PbTiO3 Morphotropic Phase Boundary,Ferroelectrics Letters, vol. 12, pp. 63-69, 1990.

Y. Guo, et al., Growth and electrical properties of Pb(Sc1/2Nb1/2) O3—Pb(Mg1/3Nb2/3) O3—PbTiO3 ternary single crystals by a modified Bridgman technique, Journal of Crystal Growth, 226, pp. 111-116, 2001.

* cited by examiner

TEMPERATURE AND FIELD STABLE RELAXOR-PT PIEZOELECTRIC SINGLE CRYSTALS

CROSS-REFERENCE TO RELATED APPLICATION

This application claims the benefit of, and is a divisional application of co-pending U.S. patent application Ser. No. 13/206,971, now allowed, entitled "TEMPERATURE AND FIELD STABLE RELAXOR-PT PIEZOELECTRIC SINGLE CRYSTALS", and filed Aug. 10, 2011, which claims priority to and the benefit of U.S. Provisional Application No. 61/372,439, filed Aug. 10, 2010, both of which are hereby incorporated by reference in their entirety.

STATEMENT OF FEDERALLY SPONSORED RESEARCH

Portions of the invention disclosed herein were reduced to practice with the support of the U.S. Office of Naval Research, Contract No. N00014-07-C-0858. The U.S. Government may have certain rights in this invention.

FIELD

The present invention is generally directed to ferroelectric materials, and more particularly to relaxor-PT based piezoelectric single crystals.

BACKGROUND

For the past 50 years, perovskite $Pb(Zr_xTi_{1-x})O_3$ (PZT) piezoelectric ceramics have dominated the commercial market of electronic devices, including piezoelectric sensors, actuators and medical ultrasonic transducers, due to their high piezoelectric and electromechanical coupling factors. For example, the shear piezoelectric coefficient $d_{15}$ and electromechanical coupling factor $k_{15}$ for PZT5A type (DOD Type II) materials are found to be on the order of about 400 pC/N and approximately 70%, respectively. Innovations in electronic devices have been the driving force for new developments in piezoelectric materials, including relaxor-PT single crystals.

The excellent piezoelectric properties of relaxor-PT single crystals, including $Pb(Mg_{1/3}Nb_{2/3})O_3$—$PbTiO_3$ ("PMN-PT") and $Pb(In_{0.5}Nb_{0.5})O_3$—$Pb(Mg_{1/3}Nb_{2/3})O_3$—$PbTiO_3$ ("PIN-PMN-PT"), have attracted considerable interest over the last decade, particularly for applications in high performance medical transducers. However, their commercial use has been limited due to high variation of the dielectric and piezoelectric properties with temperature. Furthermore, the low coercive field of current relaxor-PT crystals further limits their application.

Single crystal compositions near their respective morphotropic phase boundaries (MPB) exhibit longitudinal piezoelectric coefficients ($d_{33}$) greater than 1500 pC/N with electromechanical coupling factors higher than 90% along the pseudo-cubic <001> directions. These excellent properties make relaxor-PT single crystals promising candidates for broadband and high sensitivity ultrasonic transducers, sensors and other electromechanical devices. Specifically, certain applications of sensors and transducers, such as accelerometers, vector sensors and non-destructive evaluation (NDE) transducers, require large shear coefficients $d_{15}$.

It has been reported that rhombohedral single domain PMN-PT crystals poled along their spontaneous polarization direction [111], which may be referred to as having the engineered domain configuration '1R', where '1' represents a single domain crystal and 'R' represents the rhombohedral phase, possess high shear values. For these materials, piezoelectric coefficients, $d_{15}$, and shear coupling factors, $k_{15}$, are reported to be >2000 pC/N and >90%, respectively, due to the polarization rotation facilitated by the single domain state. Unfortunately, shear piezoelectric coefficients are found to increase significantly with increasing temperature, with more than a 200% change from room temperature to their respective ferroelectric phase transition temperatures. Hence, this strong temperature dependence severely limits their implementation in many electromechanical devices. Furthermore, relaxor-PT single crystals exhibit coercive fields on the order of <2-5 kV/cm, thus limiting applications requiring large AC fields, such as NDE transducers and high power sonar.

What is needed is a piezoelectric single crystal that does not suffer from one or more of the above drawbacks.

SUMMARY

According to certain exemplary embodiments, problems with known relaxor-PT single crystals are overcome by providing crystals having a large shear piezoelectric coefficient $d_{24}$ achieved through monoclinic/orthorhombic relaxor-PT single crystals with '1O' single domain configuration. Such crystals have been found to possess nearly temperature independent behavior over the temperature range of −50° C. to the orthorhombic to tetragonal phase transition temperature, generally on the order of about 75° C. to about 105° C.

Tetragonal and/or doped relaxor-PT crystals were found to possess high coercive fields and/or internal bias fields while keeping very high shear piezoelectric coefficients comparable to the values of single domain rhombohedral relaxor-PT crystals, providing crystals that can be driven in shear under a high AC field.

Single crystals with '2R' or '1O' domain configuration and/or doped relaxor-PT crystals were also found to possess zero thickness shear piezoelectric coefficients $d_{16}$ while keeping very high shear piezoelectric coefficients $d_{15}$ comparable to the values of '1R' single domain rhombohedral relaxor-PT crystals.

Rotation of face (contour) shear $d_{36}$ single crystals with '2R' domain configuration and/or relaxor-PT crystals around the crystallographic axes were found to eliminate or minimize one of the transverse width extensional piezoelectric coefficients.

The high shear piezoelectric properties of relaxor-PT single crystals with new engineered domain configurations in accordance with exemplary embodiments disclosed herein are promising for various electromechanical device applications, such as vector sensors, non-destructive evaluation (NDE) transducers and low frequency sonar transducers, to name a few.

According to an exemplary embodiment, a piezoelectric single crystal has a composition of the formula (1-x)Pb(Mg$_{1/3}$ Nb$_{2/3}$)O$_3$-xPbTiO$_3$ ("PMN-xPT") or yPb(In$_{1/2}$Nb$_{1/2}$)O$_3$-(1−y−z) Pb(Mg$_{1/3}$Nb$_{2/3}$)O$_3$-zPbTiO$_3$ ("yPIN-(1−y−z)PMN-zPT"), where 0.305≤x≤0.355, 0.26<y≤0.50, 0.31<z≤0.36. The crystal is poled along the crystallographic [110] direction and has an orthorhombic/monoclinic phase and '1O' single domain state.

According to another exemplary embodiment, a piezoelectric single crystal has the formula PMN-xPT or yPIN-(1−y−z)PMN-zPT, where 0.20<x≤0.305, 0.26<y≤0.50, $0.20<z\leq 0.31$. The crystal is poled along the crystallographic [110] direction and has a rhombohedral phase, a '2R' engineered domain configuration and macroscopic mm2 symmetry.

According to another exemplary embodiment, a piezoelectric single crystal has the formula PMN-xPT or yPIN-(1-y-z)PMN-zPT, where $x>0.355$, $0.26<y\leq 0.50$, $z>0.36$. The crystal is poled along the crystallographic [001] direction and has a '1T' single domain state and macroscopic 4 mm symmetry.

According to another exemplary embodiment, a ternary piezoelectric single crystal PIN-PMN-PT with rhombohedral phase is provided wherein the crystal is poled along the crystallographic [111] direction and rotated to provide a shear piezoelectric coefficient $d_{16}$ that is less than about 100 pC/N.

An advantage of exemplary embodiments is that a piezoelectric single crystal is provided having shear piezoelectric coefficients with temperature stability.

Another advantage of exemplary embodiments is that a piezoelectric single crystal is provided with improved AC field drive stability.

Still another advantage of exemplary embodiments is that piezoelectric single crystals are provided having shear piezoelectric coefficients that are more stable in temperature and/or electric field than previously known single crystals. Such single crystals in accordance with exemplary embodiments may be used, for example, as vibration sensors as well as low frequency, compact sonar transducers with improved and/or enhanced performance.

Other features and advantages will be apparent from the following more detailed description of exemplary embodiments, taken in conjunction with the accompanying drawings which illustrate, by way of example, the principles of the invention.

Figure 1:
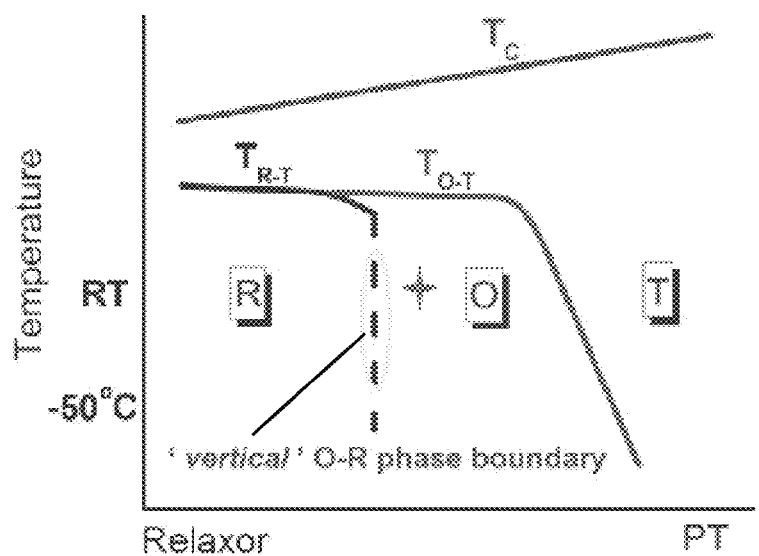
FIG. 1 is a schematic phase diagram for relaxor-PT based crystals, where R, O and T represent rhombohedral, orthorhombic/monoclinic and tetragonal phase regions.

It will be appreciated that in figures showing more than one line on a graph, identifiers are used to aid in differentiation, although the specific location of an identifier along the line is not necessarily intended to correspond to any particular data point.

DETAILED DESCRIPTION OF EXEMPLARY EMBODIMENTS

Exemplary embodiments provide for composition ranges and crystallographic orientations of piezoelectric single crystals where the shear piezoelectric coefficients are more stable in temperature and/or electric field. The disclosed piezoelectric single crystals may be used, for example, as vibration sensors and low frequency, compact sonar transducers with improved and/or enhanced performance.

It has been discovered that composition ranges and crystal cuts in accordance with exemplary embodiments give rise to certain crystal structures with increased shear coefficients. It has further been discovered that these crystal structures, composition ranges, and crystal cuts result in an unexpected improvement in shear property stability.

It has also been discovered that composition ranges and crystal cuts in accordance with exemplary embodiments give rise to certain crystal structures with eliminated or minimized transverse shear coefficients or width extensional coefficients.

Accordingly, exemplary embodiments are directed to composition ranges, crystal structures, and properties described herein that have high shear temperature stability and/or AC field stability. As used herein, the letters R, O and T refer to a domain state having a rhombohedral, orthorhombic/monoclinic, or tetragonal phase, respectively, while a leading number in front of that letter refers to the number of domains present, which may be a single domain (i.e., a leading 1) or multi-domain (e.g., a leading 2, 3 or 4).

Generally, embodiments relate to a piezoelectric single crystal having a composition with the formula (1-x)Pb(Mg$_{1/3}$Nb$_{2/3}$)O$_3$-xPbTiO$_3$ ("PMN-xPT") or yPb(In$_{1/2}$Nb$_{1/2}$)O$_3$-(1−y−z) Pb(Mg$_{1/3}$Nb$_{2/3}$)O$_3$-zPbTiO$_3$ ("yPIN-(1−y−z) PMN-zPT"), where x>0.2, 0.26≤y≤0.50, and z>0.2, the crystal having a multi-domain rhombohedral, single-domain orthorhombic/monoclinic or tetragonal phase and a finite piezoelectric shear coefficient or to a piezoelectric single crystal having a composition with the formula yPIN-(1−y−z)PMN-zPT, where 0.26≤y≤0.50, z>0.2, the crystal having a single-domain rhombohedral phase and a finite piezoelectric shear coefficient.

In one embodiment, a piezoelectric single crystal has a composition of the formula PMN-xPT or yPIN-(1−y−z) PMN-zPT, where 0.305<x≤0.355, 0.26≤y≤0.50, 0.31<z≤0.36. The crystal has an orthorhombic/monoclinic phase. The crystal is poled along the crystallographic [110] direction and has a '1O' single domain state. The crystal exhibits temperature-stable piezoelectric shear properties.

In a further embodiment, x=0.32, y=0.26, z=0.33 and the crystal has macroscopic mm2 symmetry. In some embodiments, with electrodes on the (001) faces of the crystal, the crystal has a shear vibration with a $k_{24}$ of about 85% and a shear piezoelectric coefficient $d_{24}$ of about 2000pC/N. The shear piezoelectric coefficient $d_{24}$ is substantially stable in temperature range of −50° C. to about $T_{OT}$, where the $T_{OT}$ is orthorhombic to tetragonal phase transition temperature.

In another embodiment having this composition but in which electrodes are on the (−110) faces, the crystal has a $k_{15}$ of about 90% and a shear piezoelectric coefficient $d_{15}$ of about 3000 pC/N. In such cases, the shear mode properties of yPIN-(1−y−z)PMN-zPT shows particular improved AC field stability under high drive. The coercive field is about 5 kV/cm for pure (i.e., undoped) crystals, the allowable AC field drive level of pure crystal is 40% of coercive fields, being on the order of about 2kV/cm.

In another embodiment, the piezoelectric single crystal previously described is doped with between about 0.2 mol % and about 8 mol % of a dopant selected from the group consisting of manganese, iron, cobalt, nickel, aluminum, gallium, copper, potassium sodium, fluorides and combinations thereof. In one embodiment, the dopants are provided by introducing one or more of the following compounds into the composition: MnO$_2$, MnCO$_3$, Fe$_2$O$_3$, Co$_2$O$_3$, CoCO$_3$, Ni$_2$O$_3$, NiCO$_3$, Al$_2$O$_3$, Ga$_2$O$_3$, Cu$_2$O, CuO, K$_2$CO$_3$, Na$_2$CO$_3$, fluoride and/or combinations thereof. Single crystals having such doped compositions also result in temperature stable piezoelectric shear properties. Preferably, the dopant is present at about 1 mol % to about 3 mol % and in some preferred embodiments, the dopant is manganese (introduced, e.g., by MnO$_2$ and/or MnCO$_3$). In one embodiment, x=0.32, y=0.26, z=0.33 and the crystal is doped with about 1.5 mol % manganese.

As with the pure orthorhombic/monoclinic crystal, the doped crystal may be poled along the [110] crystallographic direction to achieve a '1O' single domain state with macroscopic mm2 symmetry. In an embodiment having this composition, the crystal has electrodes on the (001) faces, a $k_{24}$ of about 85% and a shear piezoelectric coefficient $d_{24}$ of about 2000 pC/N. The shear piezoelectric coefficient $d_{24}$ was substantially stable in the usage temperature range of −50° C. to about $T_{OT}$.

In another embodiment this composition, the crystal may be poled along the [110] crystallographic direction and has electrodes on the (−110) faces, and has a $k_{15}$ of about 90% and a shear piezoelectric coefficient $d_{15}$ of about 3000 pC/N. The shear mode properties of yPIN-(1−y−z)PMN-zPT in particular showed improved AC field stability under high drive. The coercive field is further increased to about 7 to 9 kV/cm for such doped crystals, with internal bias field of about 1 kV/cm. The allowable AC field drive level of the doped crystals is 60-70% of their respective coercive fields, being on the order of about 4 to 6 kV/cm, due to the internal bias.

In one embodiment, a piezoelectric single crystal has a composition of the formula PMN-xPT or yPIN-(1−y−z)PMN-zPT, where x≥0.355, 0.26≤y≤0.50, z≥0.36, the crystal poled along the [001] direction. The crystal has a tetragonal phase, having a '1T' single domain state and macroscopic 4 mm symmetry. In one embodiment, x=0.36, y=0.26, and z=0.37.

In one embodiment of the tetragonal crystal, electrodes are on the (100) and/or (110) faces, with a $k_{15}$ of about 75-85% and a $d_{15}$ of about 1000-2500 pC/N. In such embodiments, the shear mode properties of yPIN-(1−y−z)PMN-zPT crystals in particular has improved AC field stability under high drive. The coercive field is >11 kV/cm, with an allowable AC field drive level that is about 40% of coercive fields, being on the order of about 4-5kV/cm.

In another embodiment, the piezoelectric single crystal previously described is doped with between about 0.2 mol % and about 8 mol % of a dopant selected from the group consisting of manganese, iron, cobalt, nickel, aluminum, gallium, copper, potassium sodium, fluorides and combinations therefore. The dopants may be provided by introducing one or more of the following compounds into the composition: $MnO_2$, $MnCO_3$, $Fe_2O_3$, $Co_2O_3$, $CoCO_3$, $Ni_2O_3$, $NiCO_3$, $Al_2O_3$, $Ga_2O_3$, $Cu_2O$, $CuO$, $K_2CO_3$, $Na_2CO_3$, fluoride and/or combinations thereof. Such single crystals having such doped compositions also result in temperature-stable piezoelectric shear properties. Preferably, the dopant is present at between about 1 mol % and about 3 mol % and in some preferred embodiments, the dopant is manganese (introduced, e.g., by $MnO_2$ and/or $MnCO_3$). In one embodiment, x=0.36, y=0.26, and z=0.37 and the crystal is doped with 1.5 mol % manganese.

In an embodiment where the doped tetragonal crystal has electrodes on the (100) and/or (110) faces, $k_{15}$ of about 75-85% and $d_{15}$ of about 1000-2500 pC/N, the shear mode properties of yPIN-(1−y−z)PMN-zPT crystals in particular has improved AC field stability under high drive. The coercive field is >11 kV/cm for doped crystals, with internal bias field of about 1-2 kV/cm. The allowable AC field drive level is between about 60 and about 70% of their respective coercive fields, being on the order of about 7-8kV/cm, due to the internal bias.

In yet another embodiment, a piezoelectric single crystal has a composition of the formula PMN-xPT or yPIN-(1−y−z)PMN-zPT, where 0.20≤x≤0.305, 0.26≤y≤0.50, 0.20≤z≤0.31. The crystal is in the rhombohedral phase. The crystal is poled along the crystallographic <110> direction, has a '2R' engineered domain configuration and macroscopic mm2 symmetry.

In another embodiment having of this composition, the crystal is poled along the crystallographic direction and electrodes on the (−110) faces. The crystal has no or minimal transverse piezoelectric coefficient $d_{16}$ (i.e., the absolute value of $d_{16}$ is less than about 100 pC/N, preferably less than about 50 pC/N).

In another embodiment having this composition, the crystal is poled along the [110] crystallographic direction, has electrodes on the (110) faces, and the crystal is rotated around the Z-axis (i.e., the poling axis, as will be appreciated by those of ordinary skill). The crystal has a face shear component piezoelectric coefficient $d_{36}$ that is dependent on the transverse width extensional piezoelectric coefficients $d_{31}$ and $d_{32}$ of the crystal before rotation. The crystal further exhibits an elimination or reduction of the rotated transverse width extensional piezoelectric coefficients $d_{31}'$ or $d_{32}'$ (i.e., the absolute value of the minimized rotated transverse width extensional piezoelectric coefficient is less than or equal to about 50 pC/N, preferably less than about 25 pC/N). When the $d_{31}'$ is eliminated/reduced, the crystal is rotated around the Z-axis by an angle:

$$\theta_{31} = \arctan\left(\sqrt{\frac{-d_{31}}{d_{32}}}\right)$$

When the $d_{32}'$ is eliminated/reduced, the crystal is rotated around the Z-axis by an angle:

$$\theta_{32} = \arctan\left(\sqrt{\frac{-d_{32}}{d_{31}}}\right)$$

In another embodiment having this composition, the electrodes are on the (−110) faces, with a $k_{15}$ of about 90%, a $d_{15}$ of about 2000 pC/N and a $d_{16}$ of about 50 pC/N in which shear mode properties of yPIN-(1−y−z)PMN-zPT crystals in particular has improved AC field stability under high drive. The coercive field is about 5 kV/cm, with allowable AC field drive level about 40% of the coercive field, being on the order of about 2kV/cm.

In another embodiment having this composition, the electrodes are on the (110) faces, with a $d_{32}$ of about 1270 pC/N, $d_{31}$ of about −460 pC/N and a rotation around the Z-axis of about 31.5°. The $d_{36}$ is about 1540 pC/N, $d_{31}'$ is about 780 pC/N and $d_{32}'$ is about −20 pC/N.

In another embodiment, the piezoelectric single crystal previously described is doped with between about 0.2 mol % and about 8 mol % of a dopant selected from the group consisting of manganese, iron, cobalt, nickel, aluminum, gallium, copper, potassium sodium, fluorides and combinations therefore. The dopants may be provided by introducing one or more of the following compounds into the composition: $MnO_2$, $MnCO_3$, $Fe_2O_3$, $Co_2O_3$, $CoCO_3$, $Ni_2O_3$, $NiCO_3$, $Al_2O_3$, $Ga_2O_3$, $Cu_2O$, $CuO$, $K_2CO_3$, $Na_2CO_3$, fluoride and/or combinations thereof. Single crystals having such doped compositions also result in temperature stable piezoelectric shear properties. Preferably, the dopant is present at between about 1 mol % and about 3 mol % and in some preferred embodiments, the dopant is manganese (introduced, e.g., by $MnO_2$ and/or $MnCO_3$).

In one embodiment, x=0.29, y=0.26, z=0.29, and the crystal is doped with about 1.5 mol %, manganese. In another embodiment, the crystal has a vibration direction of [−110], a $k_{is}$ of about 90% and a $d_{15}$ of about 2000 pC/N; shear mode properties of yPIN-(1−y−z)PMN-zPT crystals in particular has improved AC field stability under high drive. The coercive field is about 7 kV/cm to about 9 kV/cm for doped crystals, with internal bias field of about 1 kV/cm. The allowable AC field drive level increase to between about 60 and about 70% of the coercive field, due to the internal bias.

In one embodiment, the crystal is doped with 1.5 mol %, manganese. In another embodiment, the crystal has the electrodes on the (−110) faces, a $k_{15}$ of about 90%, a $d_{15}$ of about 2000 pC/N and a $d_{16}$ of about 0 pC/N; shear mode properties of yPIN-(1−y−z)PMN-zPT crystals in particular has improved AC field stability under high drive. The coercive field is about 7 kV/cm to about 9 kV/cm for doped crystals, with internal bias field of about 1 kV/cm. The allowable AC field drive level increase to between about 60 and about 70% of their respective coercive fields, due to the internal bias.

In one embodiment, a piezoelectric single crystal has a composition of the formula yPIN-(1−y−z)PMN-zPT, where 0.26≤y≤0.50, 0.20≤z≤0.31. The crystal is poled along the [111] crystallographic direction, has electrodes on the (1-10) faces and a '1R' domain configuration. The crystal is rotated around the X-axis by an angle:

$$\gamma = \arctan\left(\frac{d_{16}}{d_{15}}\right)$$

The crystal exhibits a rotated transverse shear coefficient $d_{16}$ of zero or some other minimal value (i.e., less than about 100 pC/N).

In another embodiment having this composition, the crystal is rotated around the X-axis by about 25° and has a $d_{15}$ of about 3300 pC/N and a $d_{16}$ of about 0 pC/N.

In another embodiment, the piezoelectric single crystal previously described is doped with between about 0.2 mol % and about 8 mol % of a dopant selected from the group consisting of manganese, iron, cobalt, nickel, aluminum, gallium, copper, potassium sodium, fluorides and combinations therefore. The dopants may be provided by introducing one or more of the following compounds into the composition: $MnO_2$, $MnCO_3$, $Fe_2O_3$, $Co_2O_3$, $CoCO_3$, $Ni_2O_3$, $NiCO_3$, $Al_2O_3$, $Ga_2O_3$, $Cu_2O$, $CuO$, $K_2CO_3$, $Na_2CO_3$, fluoride and/or combinations thereof. Single crystals having such doped compositions also result in temperature stable piezoelectric shear properties. Preferably, the dopant is present at between about 1 mol % and about 3 mol % and in some preferred embodiments, the dopant is manganese (introduced, e.g., by $MnO_2$ and/or $MnCO_3$).

The single crystals described herein can be manufactured according to any suitable techniques for crystal growth and thereafter cut using any suitable cutting techniques to achieve the desired compositions and conformations.

Figure 2:
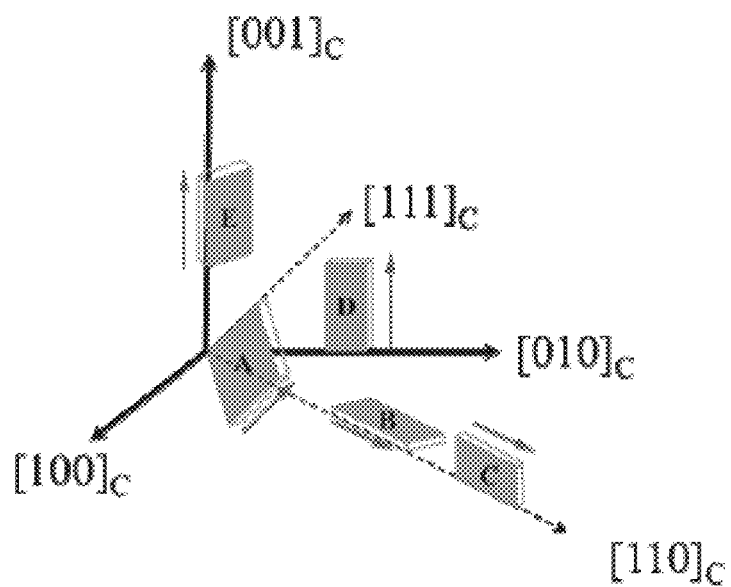
FIG. 2 is a schematic of various shear mode samples.

FIG. 1 is a schematic phase diagram for relaxor-PT based crystals, where R, O and T represent a rhombohedral phase region, an orthorhombic/monoclinic ($M_C$) phase region and a tetragonal phase region. The monoclinic ($M_C$) phase region of exemplary embodiments is a slightly distorted orthorhombic phase; thus, the $M_C$ phase region was analyzed as a pseudo-orthorhombic phase. FIG. 2 shows a schematic of various shear mode crystals, in which crystal A is [111]/(1-10); crystal B is [110]/(−110); crystal C is [110]/(001); crystal D is [001]/(110); and crystal E is [001]/(100).

According to one exemplary embodiment described herein, crystal C is provided having a new crystal cut [110]/(001), where [110] refers to the poling direction and (001) refers to the electrode orientation face, in relaxor-PT crystals, compositionally lying in the monoclinic phase. The compositions for Crystal C possess a good '1O' orthorhombic single domain state after polarization along the [110] orientation. A shear piezoelectric coefficient $d_{24}$ observed in such cases reflects comparable shear piezoelectric coefficients to $d_{15}$ in the '1R' domain state, being on the order of greater than about 2000 pC/N. The crystal C, [110]/(001) cut, exhibits good thermal stability over a wide temperature range of about −50° C. to about $T_{OT}$ (orthorhombic to tetragonal phase transition temperature). In another embodiment, tetragonal and/or doped relaxor-PT single crystals exhibit improved AC and DC driving-field stability under large signal measurements.

The temperature stability of shear piezoelectric coefficients ($d_{24}$ vs $d_{15}$ in '1O' domain state) is now briefly discussed. Shear piezoelectric response is in direct proportion to the transverse dielectric permittivity, spontaneous polarization and electrostrictive coefficient. Regardless of the occurrence of phase transitions, the variation of spontaneous polarization and electrostrictive coefficient are quite small when compared to the dielectric permittivity. Thus, the change in piezoelectric coefficient with temperature is mainly determined by the variation of the dielectric permittivity. A facilitated polarization rotation process corresponds to a 'higher' level of transverse dielectric permittivity and shear piezoelectric coefficient.

Figure 3:
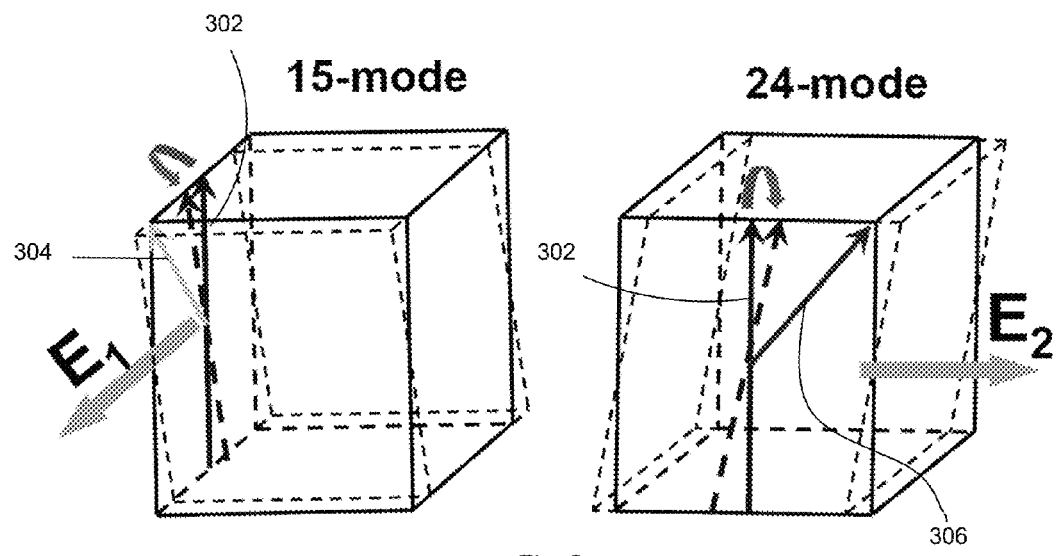
FIG. 3 shows two independent shear piezoelectric modes (15- and 24-) and related polarization rotation paths in orthorhombic crystals.

Two independent shear piezoelectric coefficients $d_{15}$ and $d_{24}$ are present for the case of [110] poled orthorhombic crystals (mm2 symmetry). As shown in FIG. 3, the polarization rotation paths of piezoelectric 15- and 24-modes are $[110]_C \rightarrow [100]_C$ and $[110]_C \rightarrow [111]_C$, respectively. FIG. 3 shows the two independent shear piezoelectric modes (15- and 24-) and related polarization rotation paths in orthorhombic crystals, where the arrow 302 represents the spontaneous polarization. The principle axes are [−110], [001] and [110] directions. The arrow 304 and the arrow 306 represent the [100] and [111] directions, respectively. The shear piezoelectric coefficient $d_{15}$ increases with temperature and/or composition as either approach an orthorhombic-tetragonal (O-T) phase boundary. The coefficient $d_{24}$ increases with temperature and/or composition as either approach an orthorhombic-rhombohedral (O-R) phase boundary. Thus, it can be found that the shear coefficient $d_{15}$ is not stable with respect to temperature for orthorhombic relaxor-PT based crystals, since the O-T phase boundary generally occurs above room temperature. In contrast to the O-T phase transition, a nearly 'vertical' O-R phase boundary exists in the phase diagram of relaxor-PT single crystal systems, as shown in FIG. 1. Utilizing this "vertical" phase boundary, orthorhombic crystal compositions can be selected near the O-R phase boundary in order to obtain high shear piezoelectric coefficients $d_{24}$, with temperature independent characteristic of $d_{24}$, since no O-R phase transition occurs in the studied temperature range for orthorhombic/monoclinic crystals.

Figure 4:
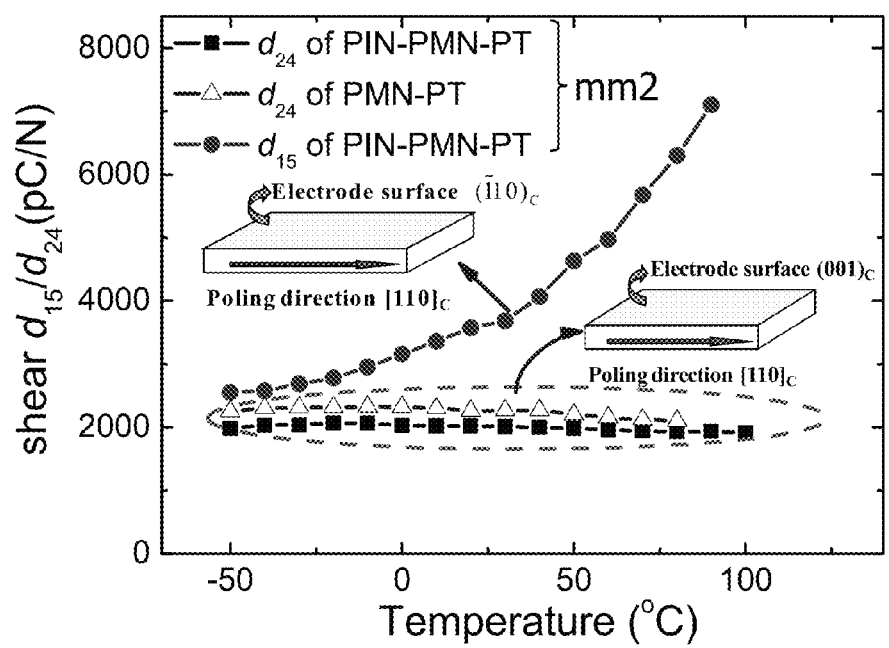
FIG. 4 shows the temperature dependence of shear piezoelectric coefficients for orthorhombic relaxor-PT based single crystals.

FIG. 4 shows the temperature dependence of shear piezoelectric coefficients for orthorhombic PMN-xPT and yPIN-(1−y−z)PMN-zPT crystals with x=0.32, y=0.26 and z=0.33. As can be seen in FIG. 4, $d_{24}$ has a nearly temperature independent characteristic. For the orthorhombic crystals, the piezoelectric coefficient $d_{24}$ is approximately 2100 pC/N for both PIN-PMN-PT and PMN-PT crystals at room temperature, maintaining similar values over the temperature range from −50° C. to their respective O-T phase transition temperatures, which are approximately 80° C. for PMN-PT and 100° C. for PIN-PMN-PT. As previously noted, however, the coefficient $d_{15}$ of orthorhombic PIN-PMN-PT crystals increased from about 2300 pC/N to about 7000 pC/N with increasing temperature from about −50° C. to about 100° C.

Figure 5A:
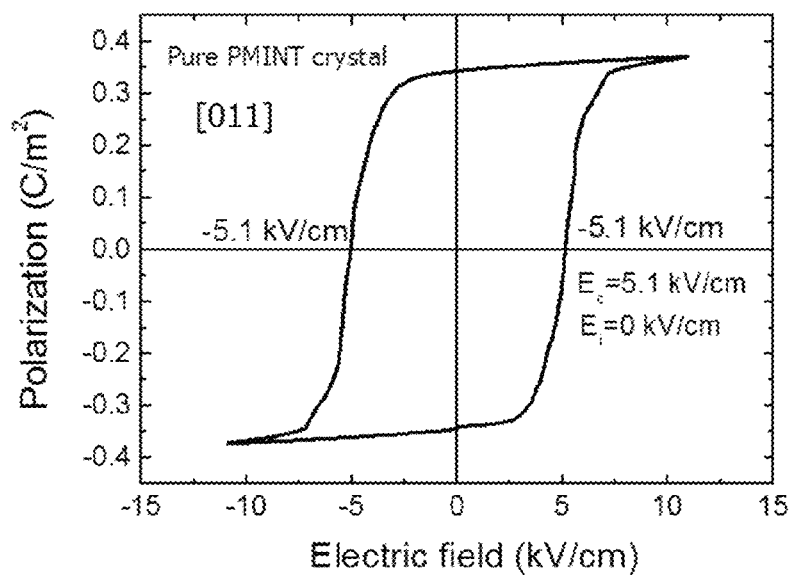
FIG. 5(a) shows the polarization hysteresis for pure $d_{15}$ [110]/(−110) PIN-PMN-PT crystals with '2R' engineered domain configuration.
Figure 5B:
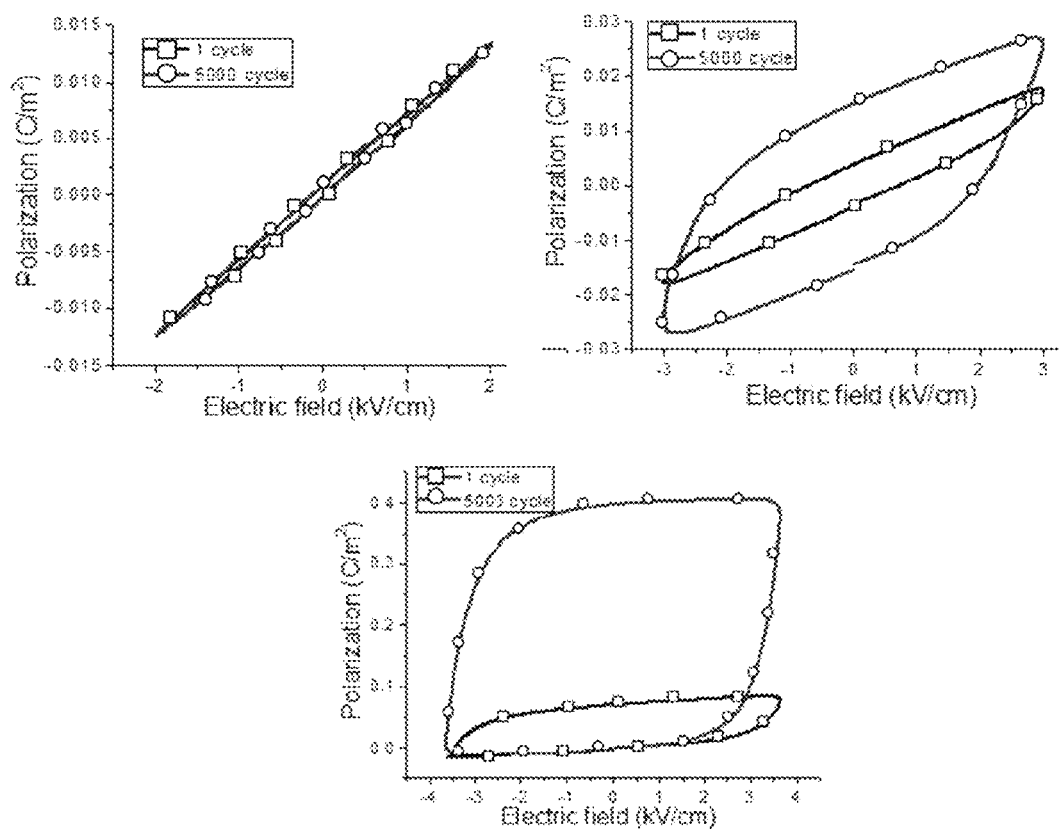
FIG. 5(b) shows the polarization loops for the first and 5000th cycles at different electric field drive levels for pure $d_{15}$ [110]/(−110) PIN-PMN-PT crystals with '2R' engineered domain configuration.
Figure 5C:
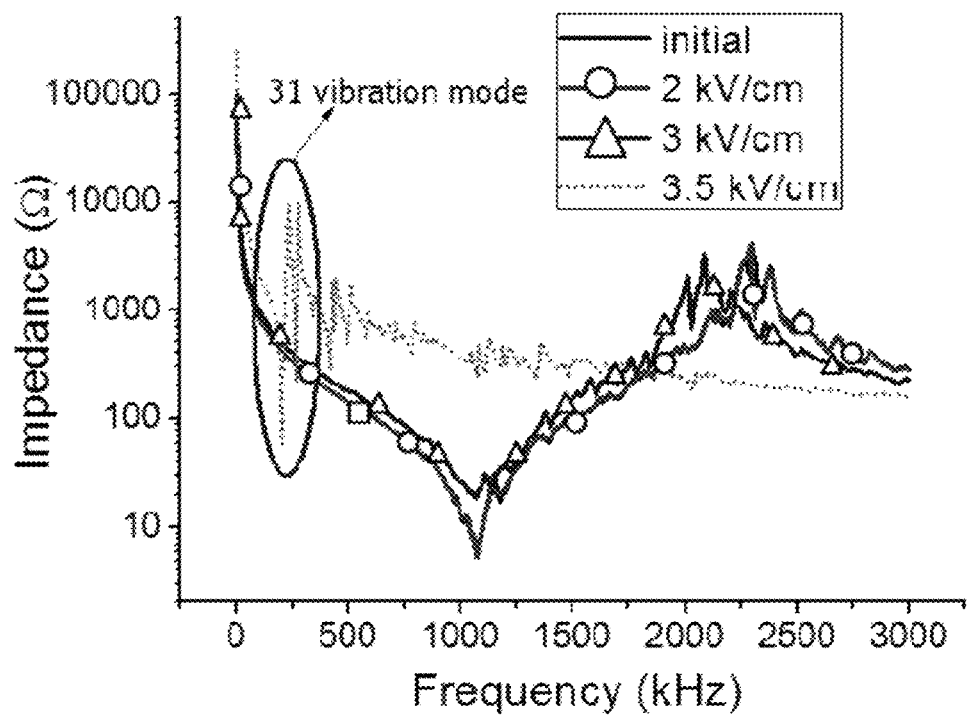
FIG. 5(c) shows the impedance characteristics for shear thickness vibration mode after cycles at different levels for pure $d_{15}$ [110]/(−110) PIN-PMN-PT crystals with '2R' engineered domain configuration.

Embodiments of the present invention also result in improved AC field drive stability. The polarization electric field behavior for pure [110]/(−110) yPIN-(1−y−z)PMN-zPT crystals, with y=0.26 and z=0.29, with a '2R' engineered domain configuration is shown in FIG. 5(a), from which the coercive field EC is found to be on the order of about 5 kV/cm for [−110] oriented samples. The polarization loops as a function of cycling and electric field drive level are given in FIG. 5(b). The impedance characteristics for shear thickness vibration mode after cycling measurements (5000 cycles) at different field levels are shown in FIG. 5(c). For an AC drive field of 2 kV/cm at a frequency of 10 Hz, the polarization versus electric field (PE) loops after 5000 cycles showed exactly the same linear behavior as the 1st cycle, indicating the samples in the poled condition exhibited no domain reversal or fatigue. This demonstrated field stability was confirmed by the impedance-frequency characteristics of shear vibrated samples, as observed in FIG. 5(c), where no impedance changes with increasing field are observed. The PE loops become nonlinear with increasing the drive field, showing hysteretic behavior. The remnant polarization was found to increase significantly to of about 0.2 C/m² after 5000 cycles at a drive field of 3.5 kV/cm, demonstrating that samples were re-poled along the applied field direction [−110]. As a consequence, the shear vibration characteristic disappeared in the impedance frequency spectra; instead, a new lateral vibration mode observed in the lower frequency range, demonstrating that the samples were poled along [−110] direction with vibration direction along [110]/[001].

Figure 6A:
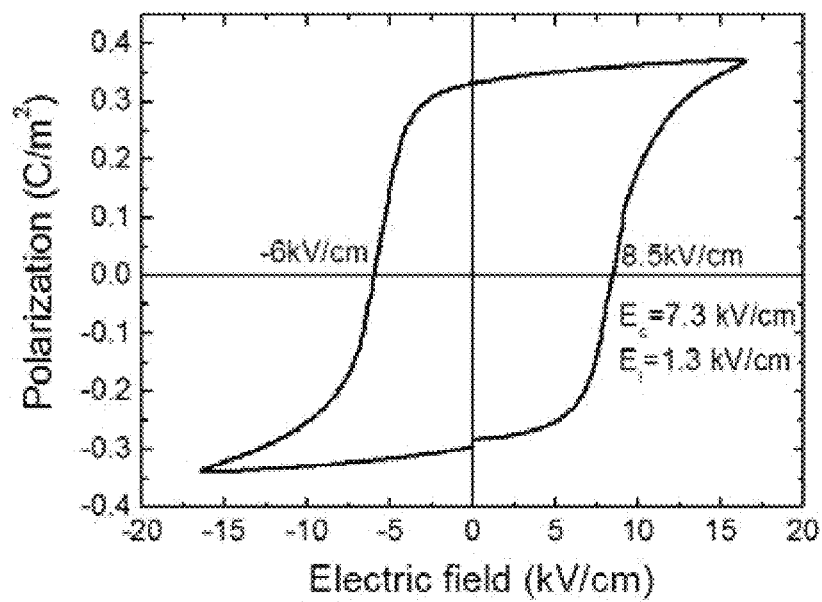
FIG. 6(a) shows the polarization hysteresis for manganese doped $d_{15}$ [110]/(−110) PIN-PMN-PT crystals with '2R' engineered domain configuration.
Figure 6B:
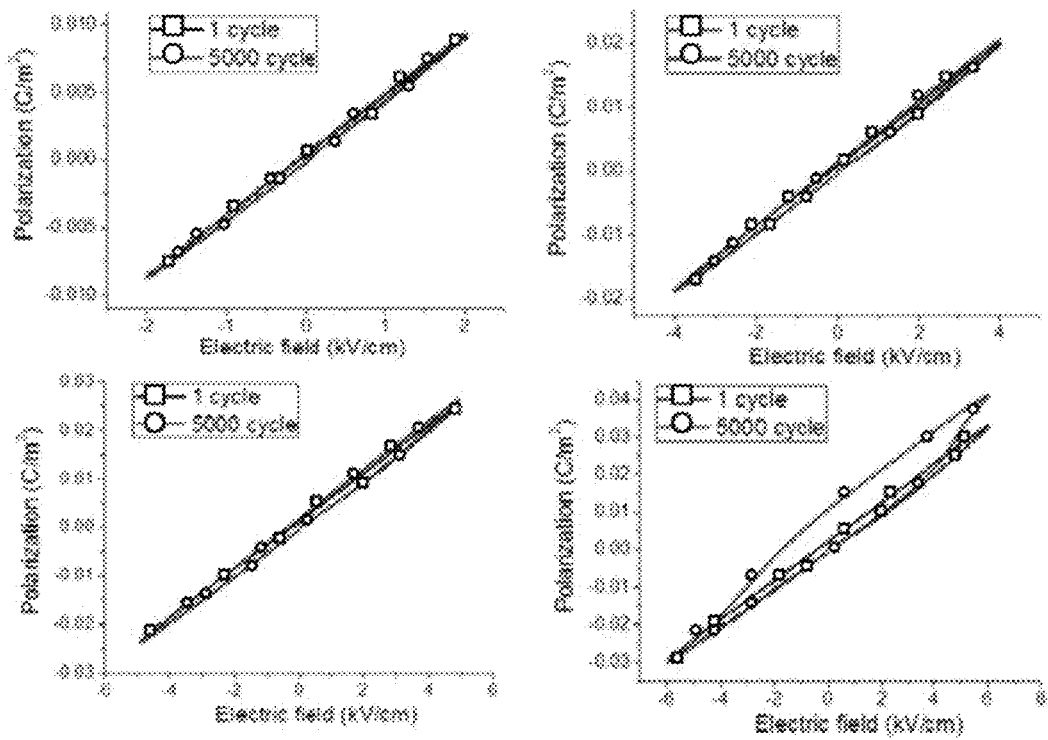
FIG. 6(b) shows the polarization loops for the first and 5000th cycles at different electric field drive levels for manganese doped $d_{15}$ [110]/(−110) PIN-PMN-PT crystals with '2R' engineered domain configuration.
Figure 6C:
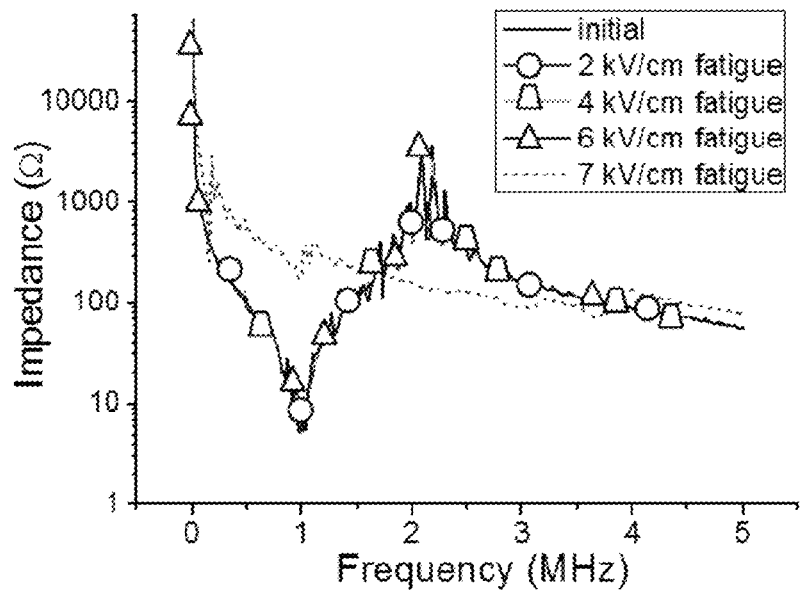
FIG. 6(c) shows the impedance characteristics for shear thickness vibration mode after cycles at different levels for manganese doped $d_{15}$ [110]/(−110) PIN-PMN-PT crystals with '2R' engineered domain configuration.

FIG. 6 shows the ferroelectric and shear electromechanical properties for 1.5 mol % manganese doped [110]/(−110) yPIN-(1−y−z)PMN-zPT crystals having the same y and z compositional ratios as discussed with respect to FIG. 5, with '2R' engineered domain configuration, where the polarization electric field behavior is shown in FIG. 6(a). The polarization electric field behavior as a function of cycling and electric field drive level (as shown in FIG. 6(b)), with the corresponding impedance characteristics for shear thickness vibration mode after fatigue measurements at different levels are given in FIG. 6(c). For the doped crystals, the coercive field was found to be on the order of approximately 7 kV/cm, with an identified internal bias field at 1.2 kV/cm, as shown in FIG. 6(a). Without wishing to be bound by theory, it is believed the development of an internal bias is due to acceptor-oxygen vacancy defect dipoles in the crystals which move to the high-stressed areas of domain walls by diffusion, pin the domain walls, and stabilize the domains. The build-up of these parallel defect dipoles to the local polarization vector leads to an offset of P-E behavior or internal bias. For an AC drive field at the level of 2-5 kV/cm at 10 Hz frequency, the polarization versus electric field (PE) loops after 5000 cycles exhibited the same linear behavior as the 1st cycle, indicating the manganese doped crystals still remain in the [110] poled condition and that no domain reversal occurred. This field polarization stability can be confirmed by the impedance-frequency characteristic of the shear-vibrated samples, as observed in FIG. 6(c).

Further increasing the AC drive field level to 6 kV/cm (near coercive field), the PE loops are larger, showing hysteretic behavior. As a consequence, the shear vibration characteristic disappeared with a new lateral vibration mode appear in the impedance frequency spectra. Thus, the combination of a high coercive field and internal bias in manganese doped PIN-PMN-PT crystals allowed a higher AC drive field level than pure crystals.

Figure 7A:
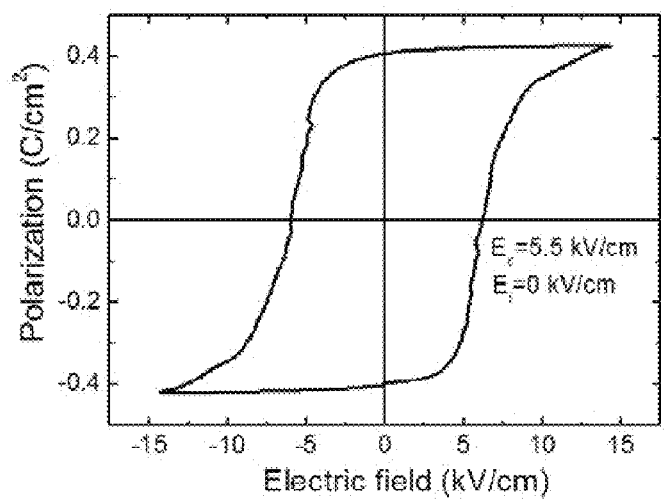
FIG. 7(a) shows the polarization hysteresis for pure $d_{15}$ [110]/(−110) PIN-PMN-PT crystals with '1O' engineered domain configuration.
Figure 7B:
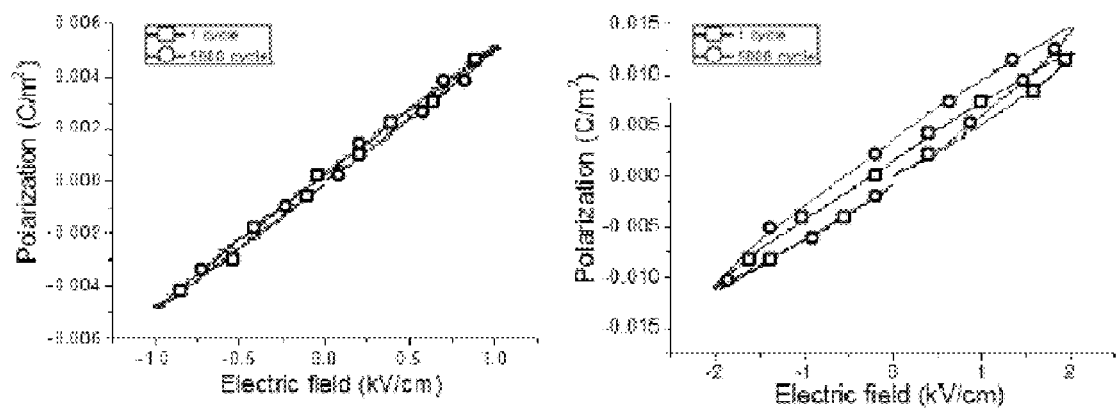
FIG. 7(b) shows polarization loops for the first and 5000th cycles at different electric field drive levels for pure $d_{15}$ [110]/(−110) PIN-PMN-PT crystals with '1O' engineered domain configuration.
Figure 7C:
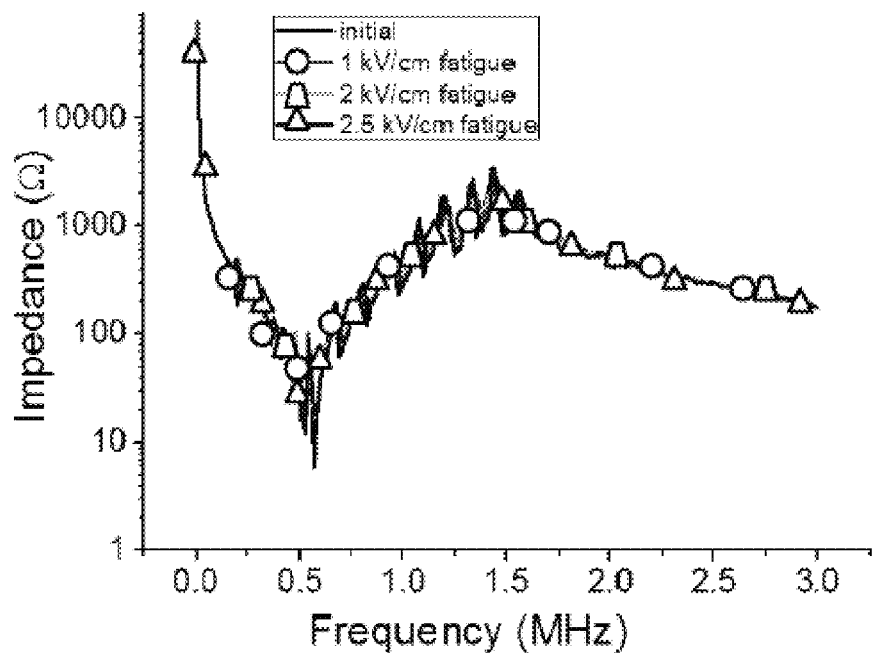
FIG. 7(c) shows impedance characteristics for shear thickness vibration mode after cycles at different levels for pure $d_{15}$ [110]/(−110) PIN-PMN-PT crystals with '1O' engineered domain configuration.
Figure 8A:
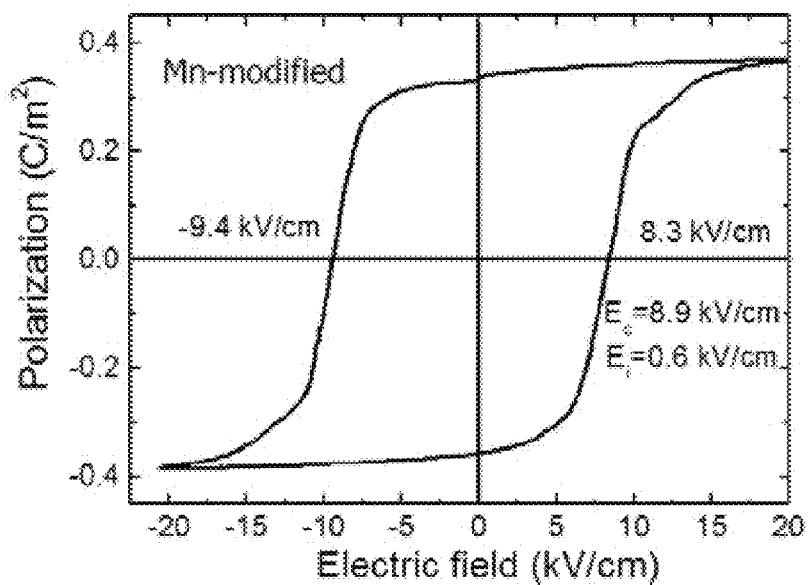
FIG. 8(a) shows polarization hysteresis for manganese doped $d_{15}$ [110]/(−110) PIN-PMN-PT crystals with '1O' engineered domain configuration.
Figure 8B:
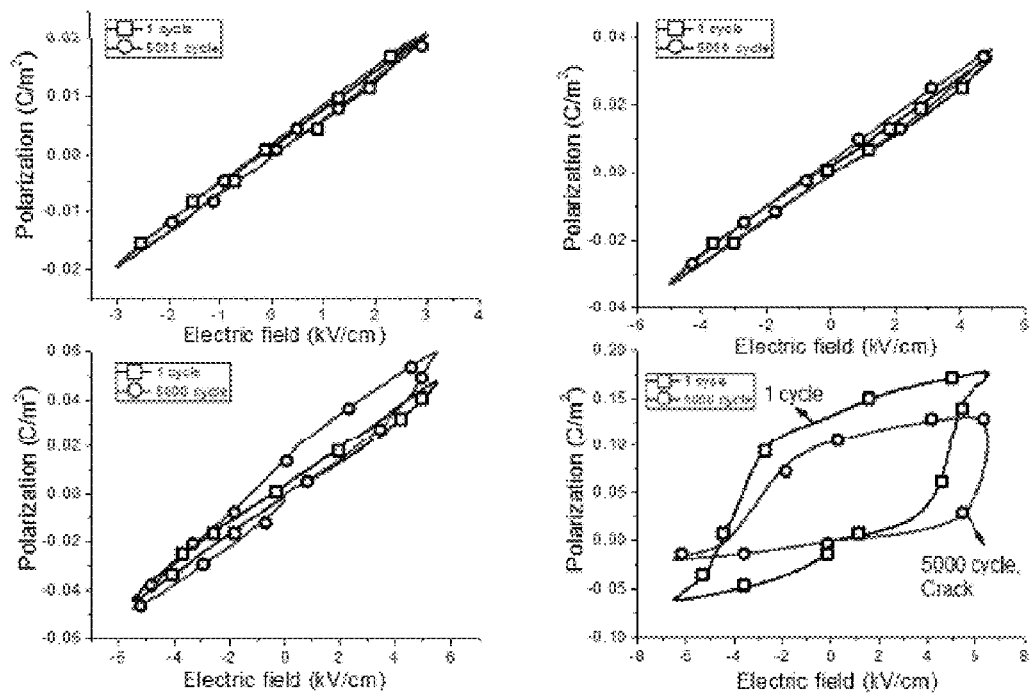
FIG. 8(b) shows polarization loops for the first and 5000th cycles at different electric field drive levels for manganese doped $d_{15}$ [110]/(−110) PIN-PMN-PT crystals with '1O' engineered domain configuration.
Figure 8C:
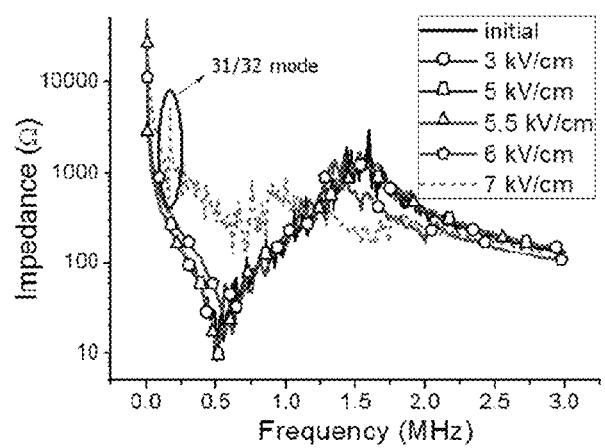
FIG. 8(c) shows impedance characteristics for shear thickness vibration mode after cycles at different levels for manganese doped $d_{15}$ [110]/(−110) PIN-PMN-PT crystals with '1O' engineered domain configuration.

The ferroelectric and shear mode electromechanical properties for pure and manganese doped [110]/(−110) yPIN-(1−y−z)PMN-zPT crystals, with y=0.26 and z=0.33 and manganese about 1.5%, with '1O' domain configurations are shown in FIG. 7 and FIG. 8, respectively. As discussed for FIG. 5 and FIG. 6, the stability of AC drive field for pure PIN-PMN-PT crystals with '1O' engineered domain configuration was found to be about 2 kV/cm, while being on the order of about 5 kV/cm for the manganese doped crystals with the same domain configuration, attributable to the higher coercive field and internal bias field in the doped crystals.

Figure 9A:
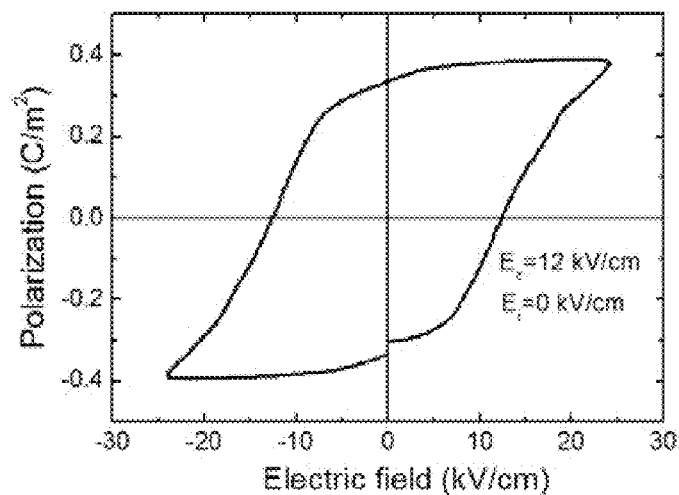
FIG. 9(a) shows polarization hysteresis for pure [001]/(100) PIN-PMN-PT crystals with '1T' engineered domain configuration.
Figure 9B:
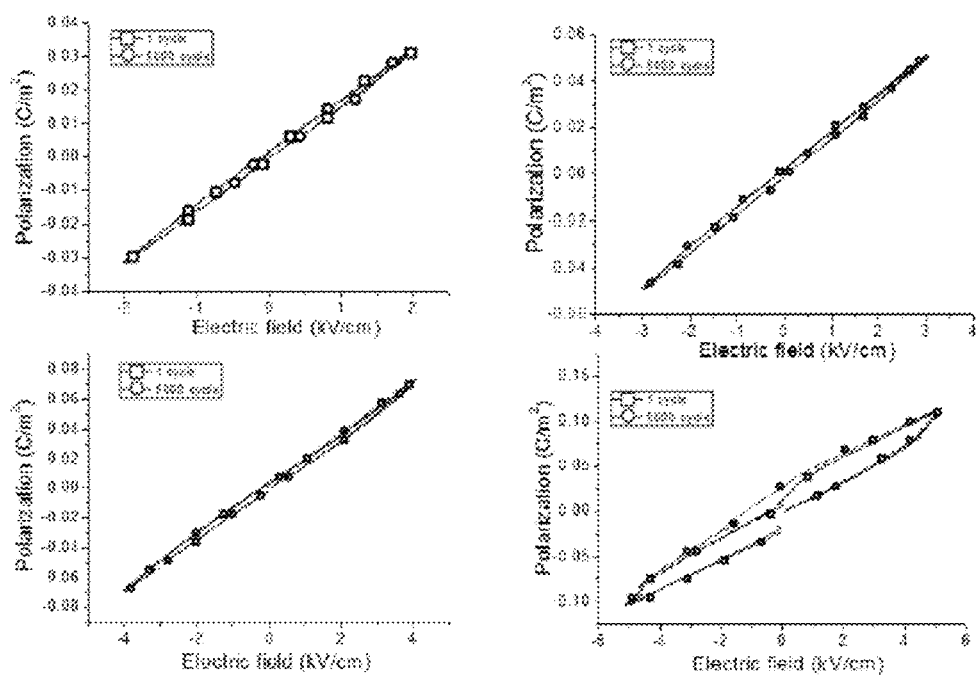
FIG. 9(b) shows polarization loops for the first and 5000th cycles at different electric field drive levels for pure [001]/(100) PIN-PMN-PT crystals with '1T' engineered domain configuration.
Figure 9C:
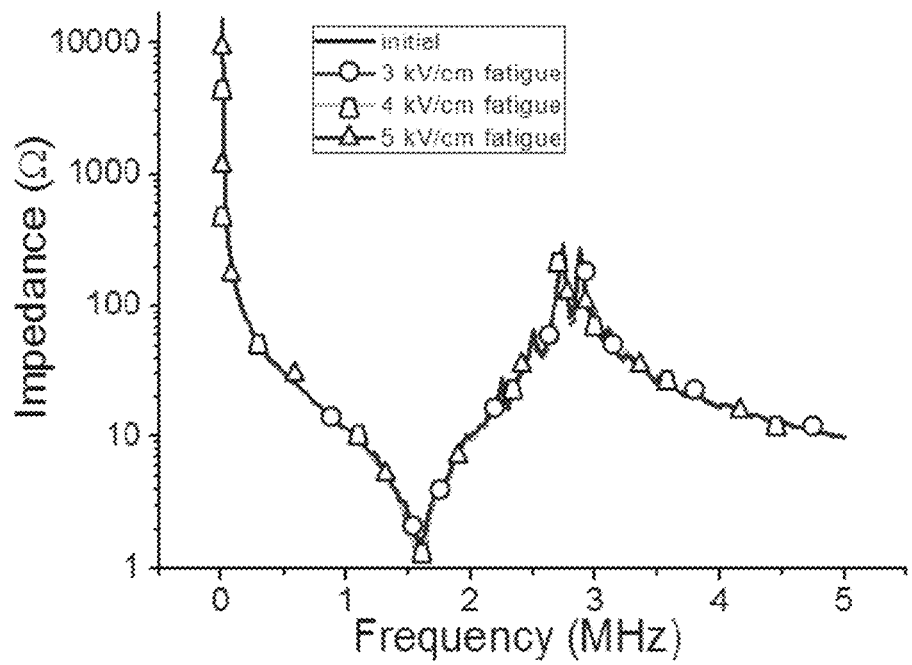
FIG. 9(c) shows impedance characteristics for shear thickness vibration mode after cycles at different levels for pure [001]/(100) PIN-PMN-PT crystals with '1T' engineered domain configuration.
Figure 10A:
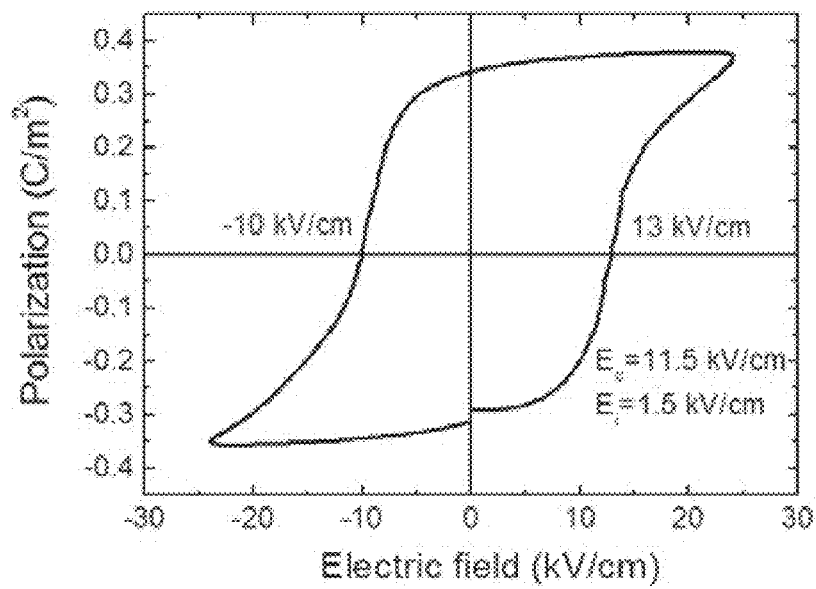
FIG. 10(a) shows polarization hysteresis for manganese doped [001]/(100) PIN-PMN-PT crystals with '1T' engineered domain configuration.
Figure 10B:
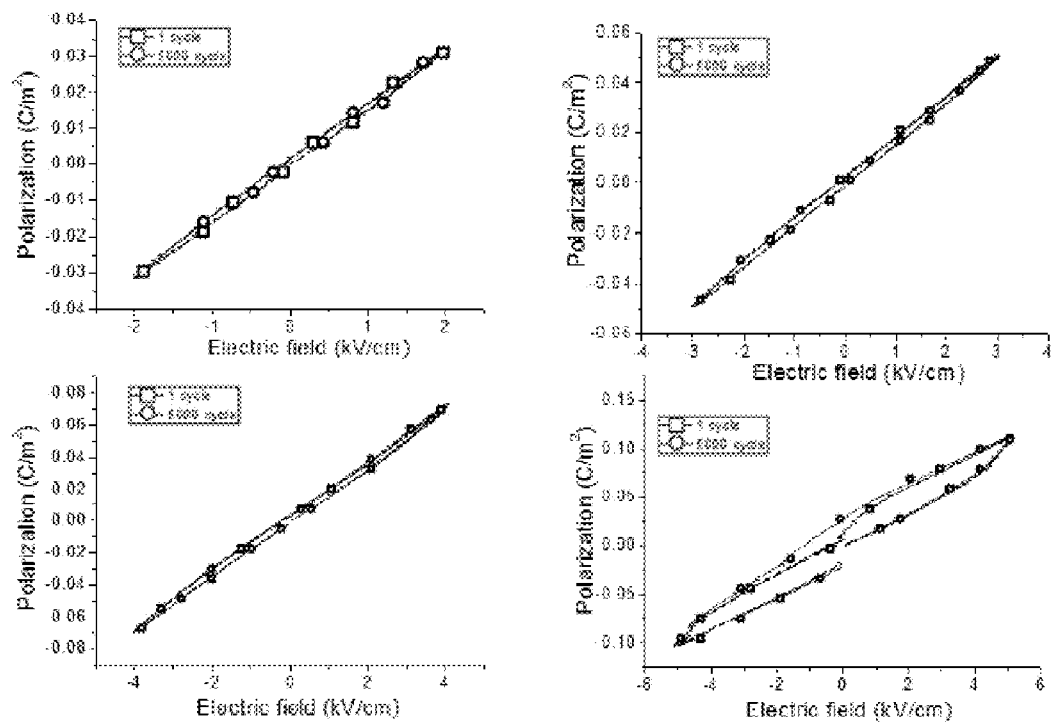
FIG. 10(b) shows polarization loops for the first and 5000th cycles at different electric field drive levels for manganese doped [001]/(100) PIN-PMN-PT crystals with '1T' engineered domain configuration.
Figure 10C:
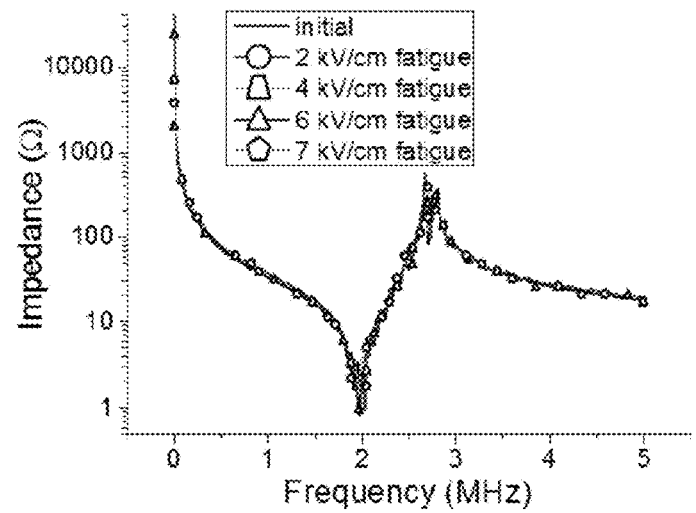
FIG. 10(c) shows impedance characteristics for shear thickness vibration mode after cycles at different levels for manganese doped [001]/(100) PIN-PMN-PT crystals with '1T' engineered domain configuration.

FIG. 9(a) and FIG. 10(a) give the polarization hysteresis for, respectively, pure and manganese doped [001]/(100) yPIN-(1−y−z)PMN-zPT tetragonal crystals with '1T' domain configurations, with y=0.26 and z=0.37. In the doped crystals, manganese doping was about 1.5 mol %. The polarization loops as a function of cycling and electric field levels are shown in FIGS. 9(b) & 10(b), with impedance characteristics for shear thickness vibration mode samples after fatigue cycling are shown in FIGS. 9(c) & 10(c), respectively. In contrast to the rhombohedral and/or monoclinic crystals, the tetragonal PIN-PMN-PT samples were found to possess relatively high coercive field, being on the order of 11 kV/cm, thus in favor of the large AC drive field, without any depoling and/or degradation of the shear mode properties until 4-5 kV/cm, while manganese doping further increased the drive field level to 6 kV/cm.

Figure 11A:
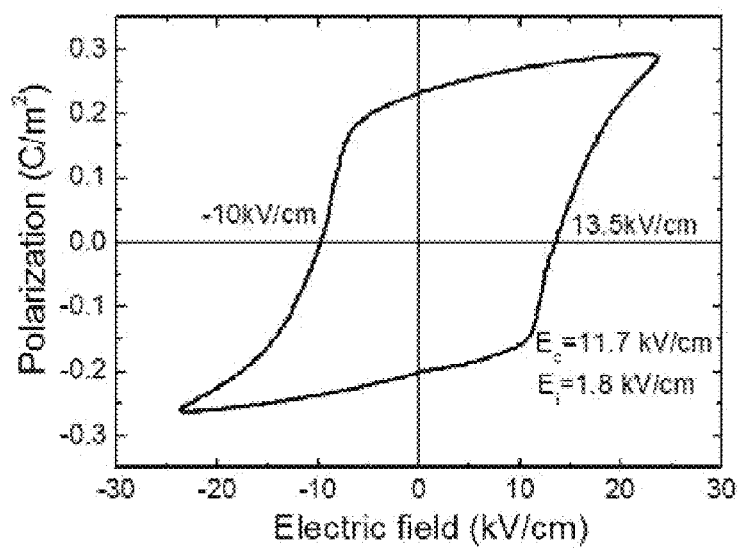
FIG. 11(a) shows polarization hysteresis for manganese doped [001]/(110) PIN-PMN-PT crystals with '1T' engineered domain configuration.
Figure 11B:
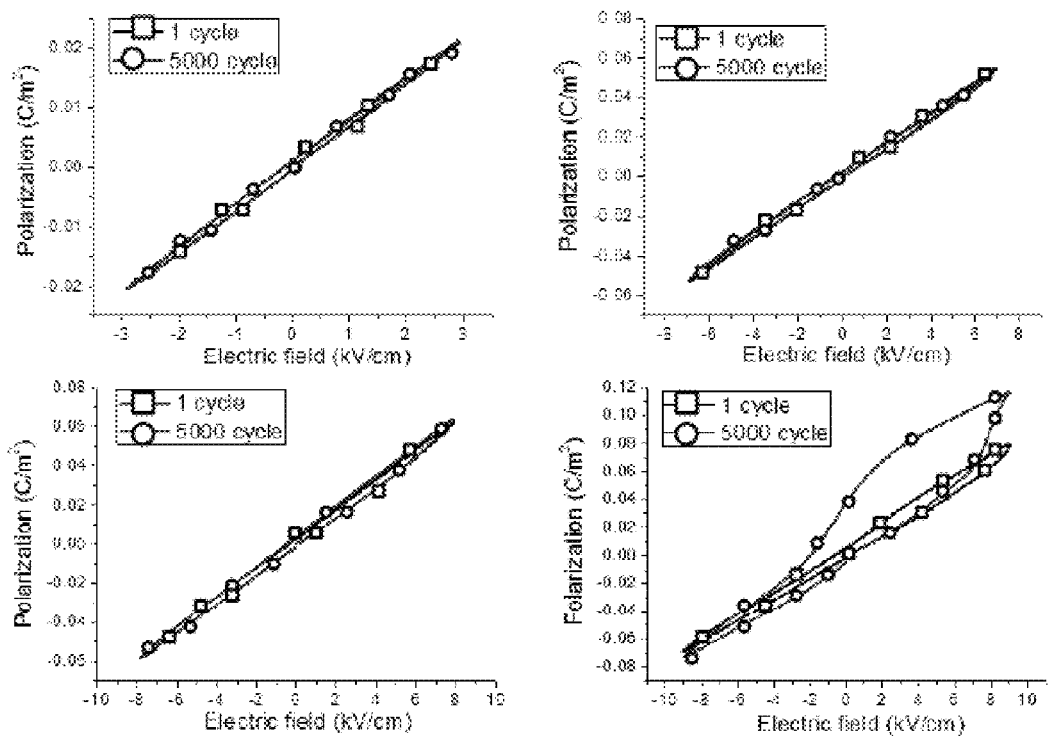
FIG. 11(b) shows polarization loops for the first and 5000th cycles at different electric field drive levels for manganese doped [001]/(110) PIN-PMN-PT crystals with '1T' engineered domain configuration.
Figure 11C:
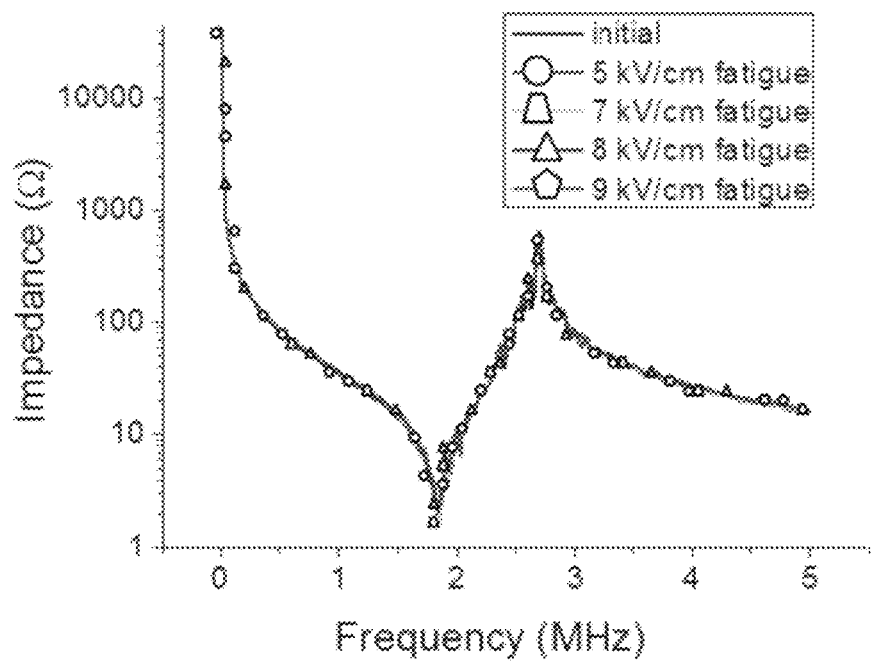
FIG. 11(c) shows impedance characteristics for shear thickness vibration mode after cycles at different levels for manganese doped $d_{15}$ [001]/(110) PIN-PMN-PT crystals with '1T' engineered domain configuration.

FIG. 11 shows the ferroelectric and shear mode electromechanical properties for the manganese doped [001]/(110) tetragonal PIN-PMN-PT crystals with a '1T' domain configuration discussed with respect to FIG. 10(a)-(c). The polarization electric field behavior is given in FIG. 11(a); polarization loops as a function of cycling and electric field drive levels are shown in FIG. 11(b), while impedance characteristics for the shear thickness vibration mode after fatigue/cycling measurements at different levels are given in FIG. 11(c). The shear piezoelectric properties are comparable to [001]/(100) crystals, but with significantly higher allowable AC drive field, being on the order of 8 kV/cm.

Figure 12A:
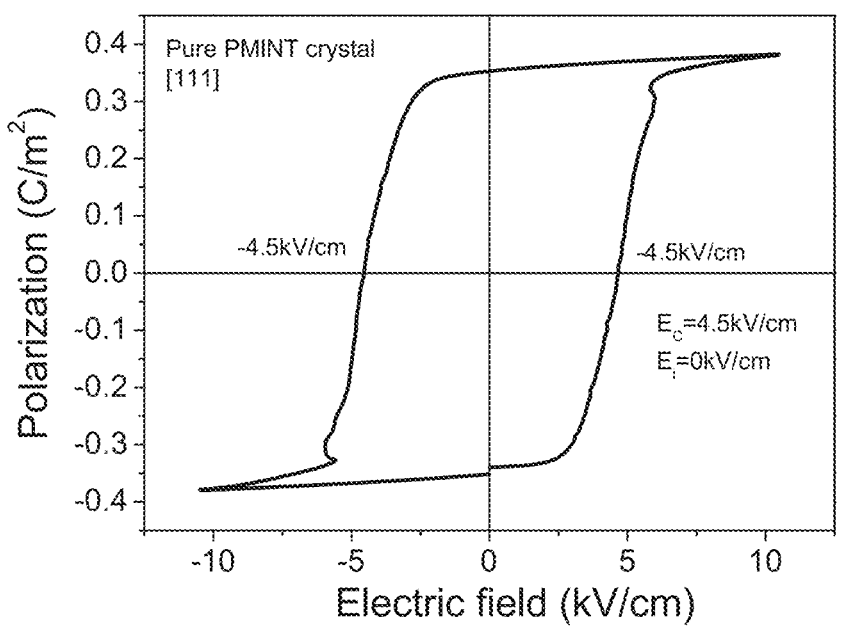
FIG. 12(a) shows the polarization hysteresis for pure $d_{15}$ [111]/(1-10) PIN-PMN-PT crystals with '1R' engineered domain configuration.
Figure 12B:
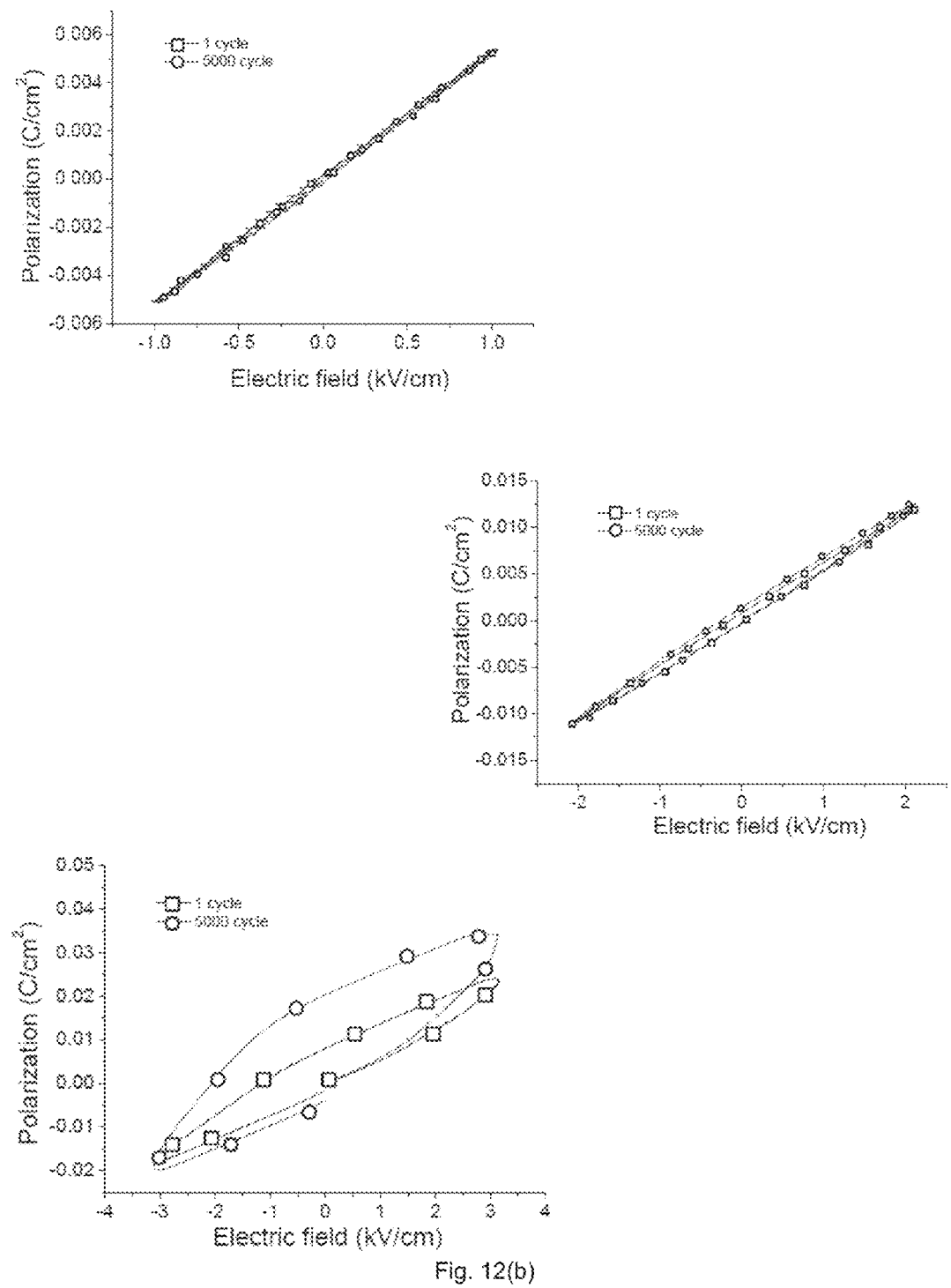
FIG. 12(b) shows the polarization loops for the first and 5000th cycles at different electric field drive levels for pure $d_{15}$ [111]/(1-10) PIN-PMN-PT crystals with '1R' engineered domain configuration.
Figure 12C:
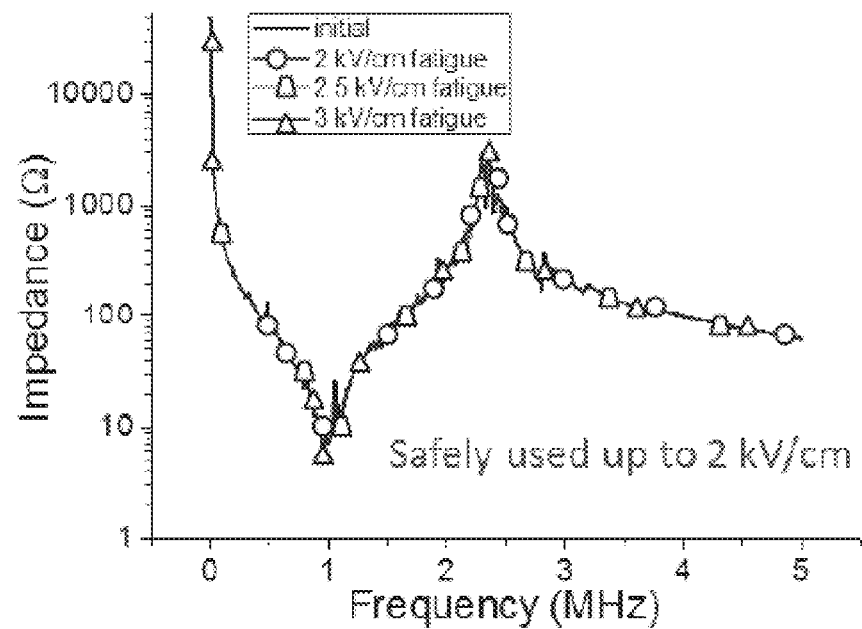
FIG. 12(c) shows the impedance characteristics for shear thickness vibration mode after cycles at different levels for pure $d_{15}$ [111]/(1-10) PIN-PMN-PT crystals with '1R' engineered domain configuration.

The polarization electric field behavior for pure [111]/(1-10) yPIN-(1−y−z)PMN-zPT crystals, with y=0.26 and z=0.29, with a '1R' single domain configuration is shown in FIG. 12(a), from which the coercive field $E_C$ is found to be on the order of about 4.5 kV/cm for [1-10] oriented samples. The polarization loops as a function of cycling and electric field drive level are given in FIG. 12(b). The impedance characteristics for shear thickness vibration mode after cycling measurements (5000 cycles) at different field levels are shown in FIG. 12(c). For an AC drive field of 2 kV/cm at a frequency of 10 Hz, the polarization versus electric field (PE) loops after 5000 cycles showed the same linear behavior as the first cycle, indicating the samples in the poled condition exhibited no domain reversal or fatigue at 2kV/cm. This demonstrated field stability was confirmed by the impedance-frequency characteristics of shear vibrated samples, as observed in FIG. 12(c), where no impedance changes with increasing field are observed. The PE loops become nonlinear with increasing the drive field, showing hysteretic behavior. The remnant polarization was found to increase to about 0.01 C/m² after 5000 cycles at a drive field of 3 kV/cm, where the impedance was observed to decrease at resonance and antiresonance frequencies, indicating the safe AC drive field is about 2kV/cm.

Figure 13A:
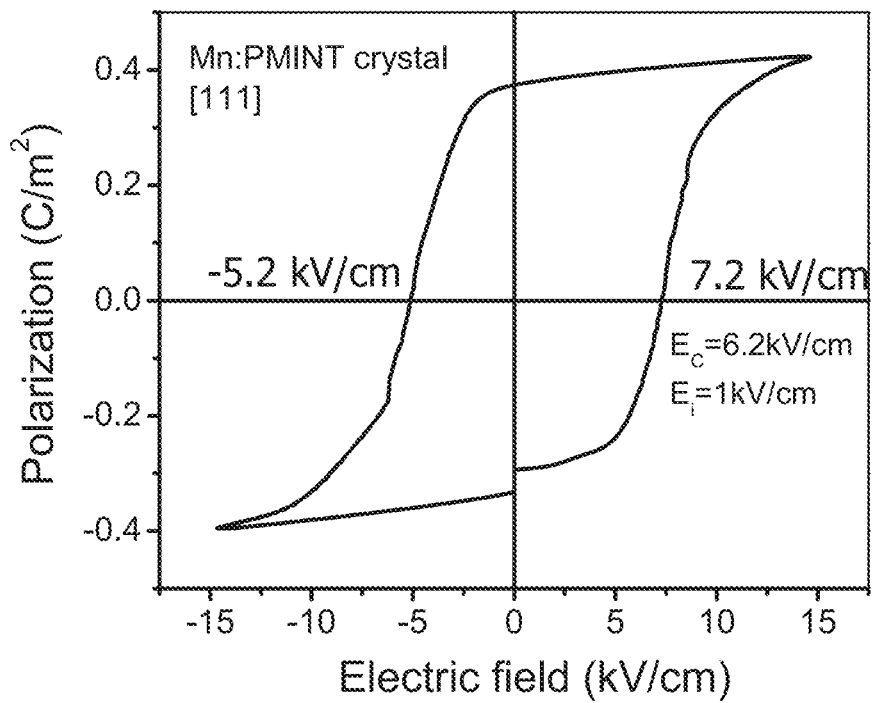
FIG. 13(a) shows the polarization hysteresis for manganese doped $d_{15}$ [111]/(1-10) PIN-PMN-PT crystals with '1R' engineered domain configuration.
Figure 13B:
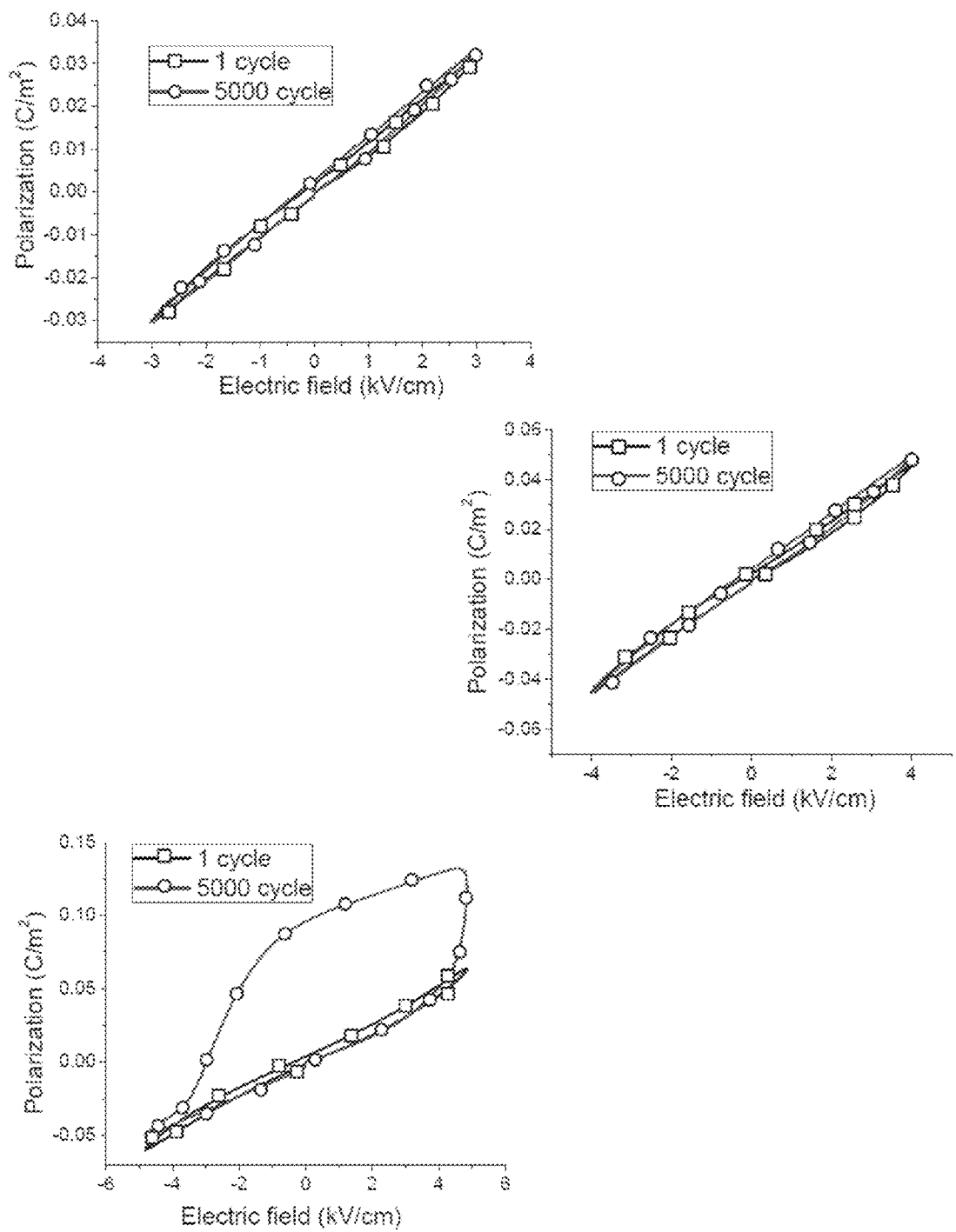
FIG. 13(b) shows the polarization loops for the first and 5000th cycles at different electric field drive levels for manganese doped $d_{15}$ [111]/(1-10) PIN-PMN-PT crystals with '1R' engineered domain configuration.
Figure 13C:
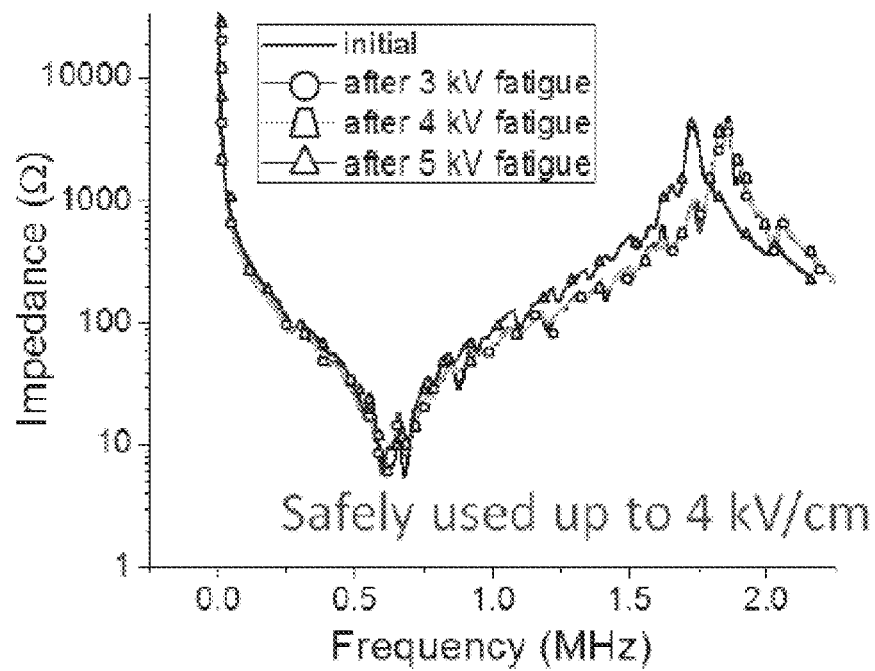
FIG. 13(c) shows the impedance characteristics for shear thickness vibration mode after cycles at different levels for manganese doped $d_{15}$ [111]/(1-10) PIN-PMN-PT crystals with '1R' engineered domain configuration.

FIG. 13 shows the ferroelectric and shear electromechanical properties for manganese doped [111]/(1-10) yPIN-(1-y-z)PMN-zPT crystals, with y=0.26 and z=0.29 and manganese about 1.5 mol %, with '1R' engineered domain configuration, where the polarization electric field behavior is shown in FIG. 13(a). As shown, the polarization electric field behavior as a function of cycling and electric field drive level (shown in FIG. 13(b)), with the corresponding impedance characteristics for shear thickness vibration mode after fatigue measurements at different levels are given in FIG. 13(c). For the doped crystals, the coercive field was found to be on the order of 6.2 kV/cm, with an internal bias field at 1 kV/cm, as shown in FIG. 13(a). For an AC drive field at the level of 2-4 kV/cm at 10 Hz frequency, the polarization versus electric field (PE) loops after 5000 cycles exhibited the same linear behavior as the first cycle, indicating the Mn-doped crystals still remain in the [111] poled condition and no domain reversal occurred. This field polarization stability can be confirmed by the impedance-frequency characteristic of the shear-vibrated samples, as observed in FIG. 13(c). Further increasing the AC drive field level to 5 kV/cm (near coercive field), the PE loops are larger, showing hysteretic behavior. As a consequence, the antiresonance frequency of the thickness shear vibration was found to shift to lower frequency range, indicating degraded piezoelectric properties. The combination of high coercive field and internal bias in manganese modified PIN-PMN-PT crystals allowed much higher AC drive field level compared to pure crystals.

Table I summarizes the properties of various shear modes in pure and manganese modified relaxor-PT single crystals in accordance with exemplary embodiments in which '1R', '1O' and '1T' are in single domain states while the '2R' configuration is in a multi domain state. The coercive field(s) of pure PIN-PMN-PT with R and/or O phases were found to be on the order of 5 kV/cm, while coercive fields were 6-9 kV/cm for manganese modified crystals, with internal biases being on the order of 0.6-1.8 kV/cm. The piezoelectric shear coefficient, $d_{15}$, and electromechanical coupling factor, $k_{15}$, were found to be approximately 3000 pC/N and >90%, respectively for undoped crystals, with allowable AC drive fields at about 2 kV/cm. The manganese modified PIN-PMN-PT was found to possess comparable shear piezoelectric properties to the undoped counterpart, but with much higher allowable AC drive field levels, being on the order of 4-5kV/cm, due to their enhanced coercive fields and developed internal biases.

For the tetragonal crystals with '1T' single domain state, the coercive fields were found to be improved, being on the order of 11 kV/cm, further increasing to 11.5 kV/cm when doped with manganese, with internal bias being 1.5 kV/cm. The allowable AC drive fields were found to increase, being in the range of 6.5-8.5 kV/cm. The piezoelectric and electromechanical coupling, however, were found to be about 1200 pC/N and 0.77, respectively, for Mn doped tetragonal PIN-PMN-PT crystals. It is interesting to note that the field stability levels (max allowable AC drive fields divided by their respective coercive fields) are on the order of approximately 40% for all the pure crystals, while the values increased to about 60-70% for the manganese modified crystals, due to the developed internal biases. Furthermore, it is observed with increasing internal bias levels, the field stability levels increase. Thus, both coercive field and internal bias can play a role in field stability levels.

TABLE I

| Poling/ electrode | Engineered domain | Crystal | Ec (kV/cm) | $E_{init}$ (kV/cm) | ε | $d_{ij}$ (pC/N) | $k_{ij}$ | Nr (Hzm) | ac field stability (kV/cm) | Field Stability Ratio |
|---|---|---|---|---|---|---|---|---|---|---|
| 110/−110 | 2R ($d_{15}$) | PMNT-Mn | 2.6 | / | 6000 | 2500 | 0.90 | 500 | <1 | <40% |
| 111/1-10 | 1R ($d_{15}$) | Pure PIN | 4.5 | / | 6000 | 3500 | 0.93 | 470 | 2 | 44% |
|  |  | PIN-Mn | 6.2 | 1.0 | 8000 | 4100 | 0.94 | 410 | 4 | 65% |
| 110/−110 | 2R ($d_{15}$) | Pure PIN | 5.0 | / | 6500 | 2800 | 0.92 | 570 | 2 | 40% |
|  |  | PIN-Mn | 7.3 | 1.2 | 4600 | 2200 | 0.91 | 520 | 5 | 68% |
| 110/−110 | 1O ($d_{15}$) | Pure PIN | 5.5 | / | 5600 | 3400 | 0.95 | 380 | 2 | 36% |
|  |  | PIN-Mn | 9.0 | 0.6 | 5800 | 3500 | 0.95 | 360 | 5.5 | 61% |
| 001/100 | 1T ($d_{15}$) | Pure PIN | 11.0 | / | 15000 | 2200 | 0.85 | 850 | 4-5 | 41% |
|  |  | PIN-Mn | 11.5 | 1.5 | 8000 | 1200 | 0.77 | 950 | 6.5 | 57% |
| 001/110 | 1T ($d_{15}$) | PIN-Mn | 11.5 | 1.5 | 8000 | 1200 | 0.78 | 980 | 8.5 | 74% |

Of particular significance is the low frequency constant ($N_{15}$) for crystals with '1O' engineered domain configuration, being only 360-380 Hz·m, indicating the potential for low frequency transducer applications. For tetragonal single crystals, the piezoelectric and electromechanical properties were found to be lower than their counterparts, with compositions in the R and/or O phases. All the tetragonal crystals exhibit higher coercive fields, being >10 kV/cm, as a result, the AC drive field increase to 4-7 kV/cm, showing improved high field stability for high power applications.

Figure 14:
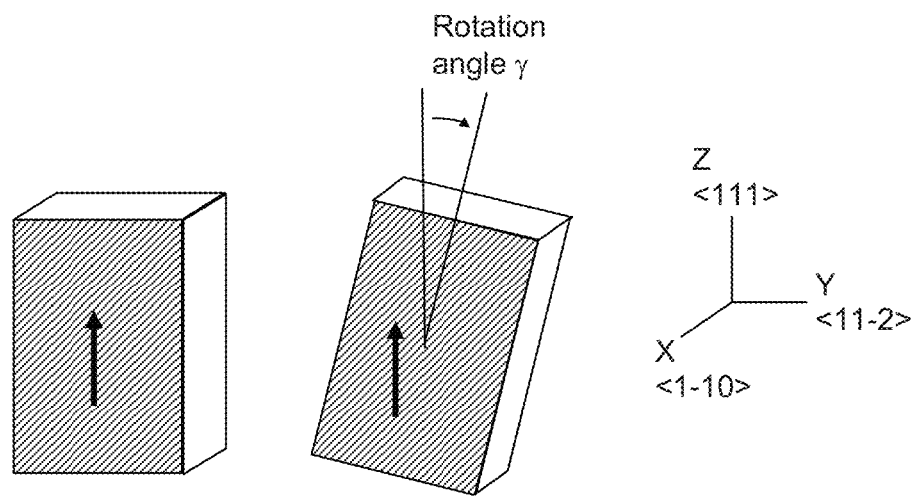
FIG. 14 shows rotation about the X axis to reduce or eliminate the $d_{16}$ coefficient while maintaining polarization in the <111> axis for $d_{15}$ [111]/(1-10) PIN-PMN-PT crystals with '1R' engineered domain configuration.
Figure 15:
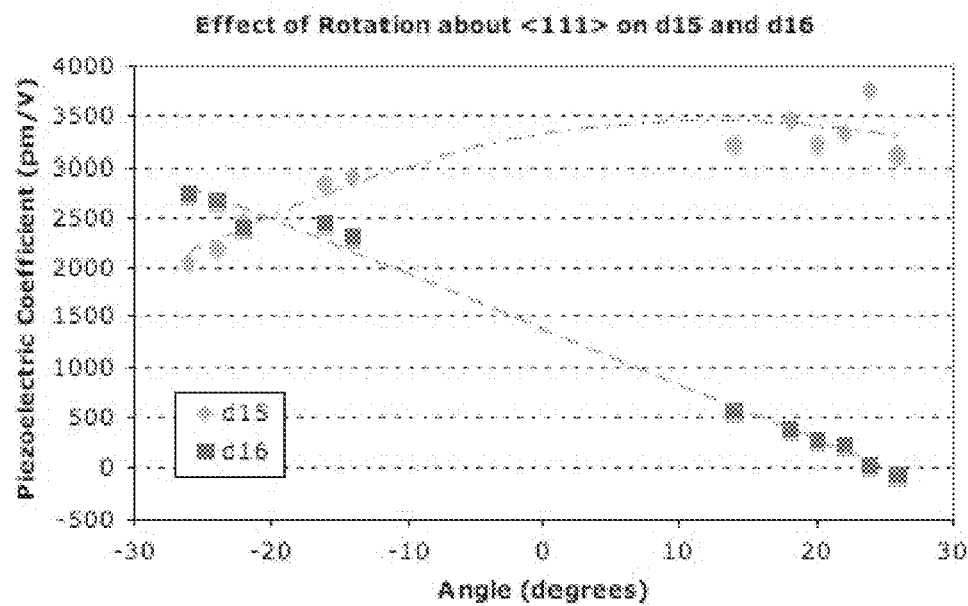
FIG. 15 the measured $d_{15}$ and $d_{16}$ shear piezoelectric coefficients for $d_{15}$ [111]/(1-10) PIN-PMN-PT crystals with '1R' domain configuration rotated about the X axis at angles from −26° to +26°.

The inventors have further determined that a zero or minimum response of the thickness shear component $d_{16}$ is obtained for pure and manganese doped rhombohedral PIN-PMN-PT crystals with '1R' engineered domain configuration by rotating around the X-axis. FIG. 14 illustrates the rotation axis of the sample geometry of the PIN-PMN-PT relative to the spontaneous [111] polarization. FIG. 15 shows the measured $d_{15}$ and $d_{16}$ and trend curves for '1R' domain configuration yPIN-(1−y−z)PMN-zPT, with y=0.26 and z=0.29, with different rotation angles around the X-axis. The rotation angle for zero $d_{16}$ was found to be about 25°. The general rotation angle around the X-axis to eliminate the transverse piezoelectric shear component for '1R' domain configuration is given by:

$$\gamma = \arctan\left(\frac{d_{16}}{d_{15}}\right)$$

where the $d_{16}$ and $d_{15}$ are the values for a non-rotated [111]/(1-10) crystal.

Figure 16:
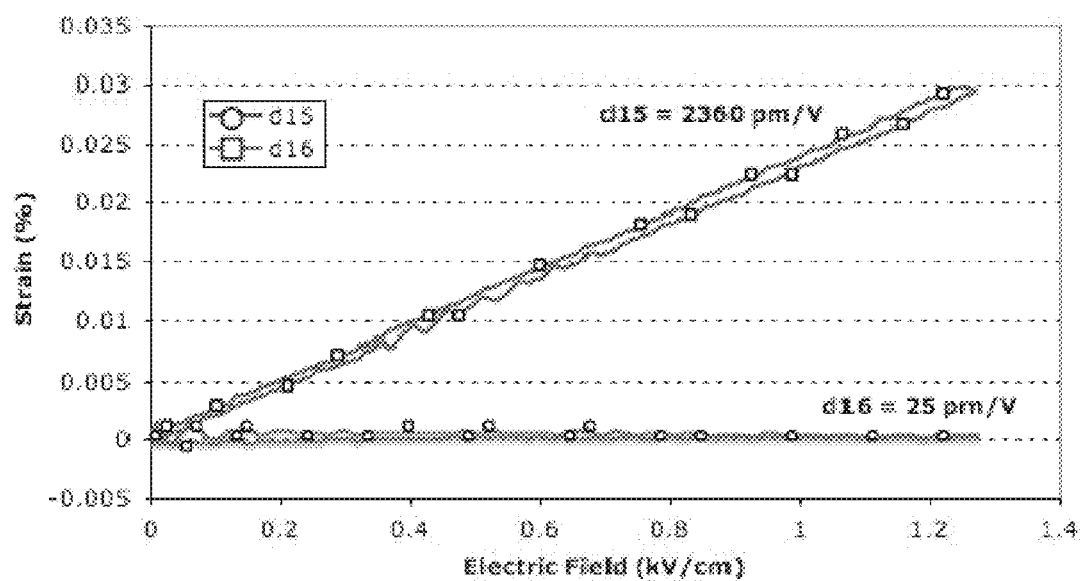
FIG. 16 shows the measured $d_{15}$ and $d_{16}$ shear strain field curves for [110]/(−110) PMN-PT crystal with '2R' engineered domain configuration
Figure 17:
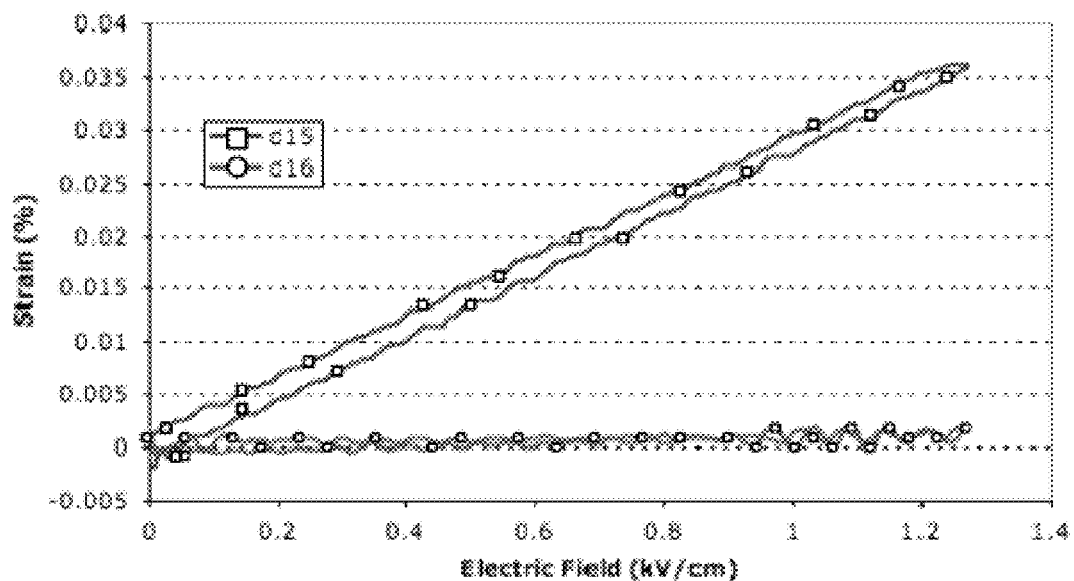
FIG. 17 shows the measured $d_{15}$ and $d_{16}$ shear strain field curves for $d_{15}$ [110]/(−110) PIN-PMN-PT crystal with '2R' engineered domain configuration.
Figure 18:
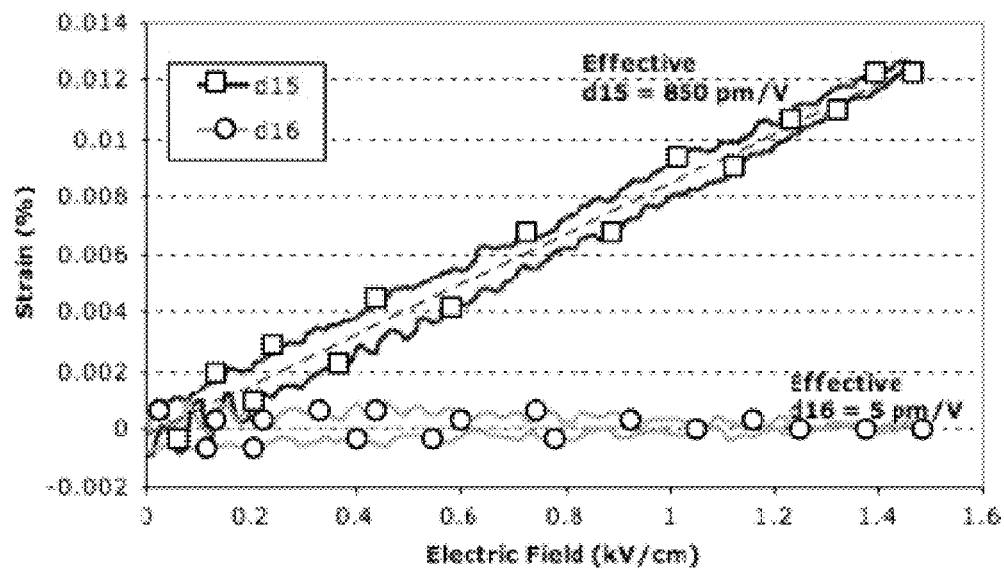
FIG. 18 shows the measured $d_{15}$ and $d_{16}$ shear strain field curves for $d_{15}$ manganese modified [110]/(−110) PIN-PMN-PT crystal stack of three bonded plates with '2R' engineered domain configuration.

FIG. 16, FIG. 17 and FIG. 18 show measured $d_{15}$ and $d_{16}$ strain field curves for [110]/(-110) PMN-xPT and pure and doped yPIN-(1-y-z)PMN-zPT, with x=0.29, y=0.26 and z=0.29 and manganese about 1.5 mol %, crystals with a '2R' domain configuration. For the PMN-PT, the piezoelectric coefficients $d_{15}$ and $d_{16}$ were approximately 2300 pC/N and 25 pC/N, respectively. For the pure PIN-PMN-PT the $d_{15}$ and $d_{16}$ were approximately 2380 pC/N and 95 pC/N, while the $d_{15}$ and $d_{16}$ for the manganese doped PIN-PMN-PT were approximately 850 pC/N and 5 pC/N. It will be appreciated that the value of $d_{16}$ is about zero in this domain configuration and that the somewhat larger measurements obtained can be attributed to crystal misorientation.

Figure 19:
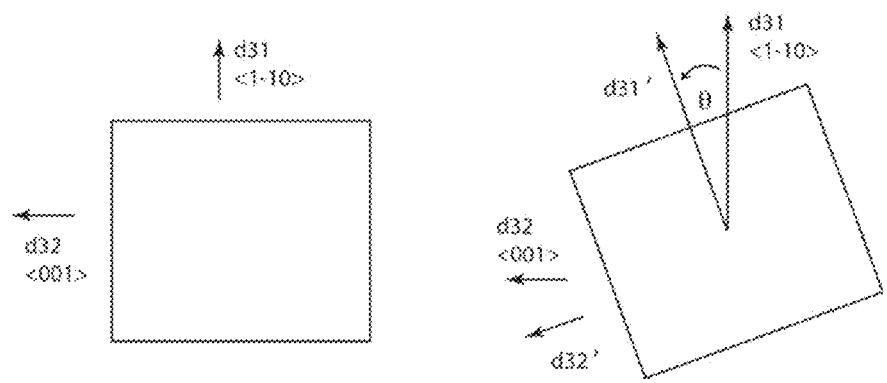
FIG. 19 shows a $d_{36}$ face shear [110]/(110) single crystal with '2R' engineered domain configuration and a rotated angle theta that eliminates one of the transverse width extensional piezoelectric coefficients $d_{31}'$ or $d_{32}'$.

FIG. 19 shows the rotational angle for elimination of either the $d_{31}'$ or $d_{32}'$ transverse width extensional piezoelectric coefficient for $d_{36}$ face shear [110]/(110) PMN-PT, PIN-PMN-PT and Mn-doped PIN-PMN-PT crystals with a '2R' domain configuration having the compositions as described with respect to FIGS. 16-18.

Figure 20:
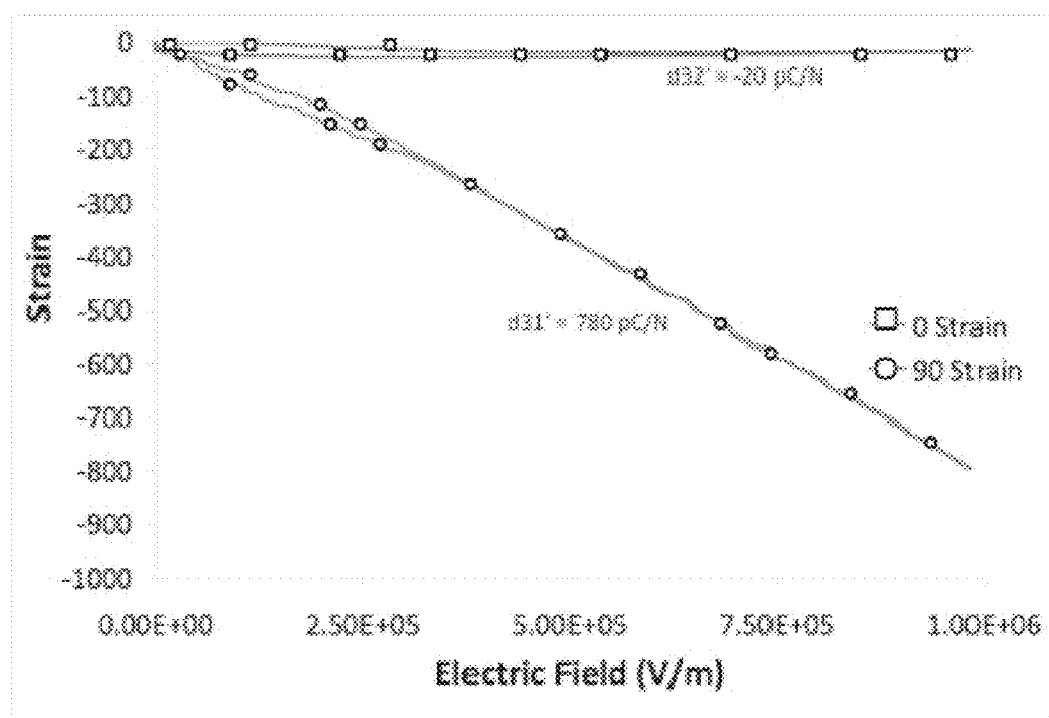
FIG. 20 shows the measured $d_{31}'$ and $d_{32}'$ strain field curves for a $d_{36}$ face shear [110]/(110) PMN-PT single crystal with '2R' engineered domain configuration, showing near elimination of the $d_{32}'$.

FIG. 20 shows the measured rotated transverse width extensional piezoelectric strain field curves for $d_{36}$ face shear [110]/(110) PMN-xPT having a '2R' domain configuration, with x=0.29. The $d_{31}'$ is about 780 pC/N and the $d_{32}'$ is about -20 pC/N.

While the foregoing specification illustrates and describes exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A piezoelectric single crystal having a composition with the formula yPb(In$_{1/2}$Nb$_{1/2}$)O$_3$-(1-y-z) Pb(Mg$_{1/3}$Nb$_{2/3}$)O$_3$- zPbTiO$_3$ ("yPIN-(1-y-z)PMN-zPT"), where 0.26≤y≤0.50, 0.31<z≤0.36 and wherein the crystal is poled along the crystallographic [110] direction, the crystal having an orthorhombic/monoclinic phase and '1O' single domain state in the range of about -50° C. to about T$_{OT}$, where T$_{OT}$ is the orthorhombic to tetragonal phase transition temperature.

2. The crystal of claim 1, having macroscopic mm2 symmetry.

3. The crystal of claim 1, wherein the crystal has electrodes on the (001) faces, a $k_{24}$ of about 85%, and a shear piezoelectric coefficient $d_{24}$ of about 2000 pC/N, the shear piezoelectric coefficient being substantially temperature stable in the range of about -50° C. to about T$_{OT}$, where T$_{OT}$ is the orthorhombic to tetragonal phase transition temperature.

4. The crystal of claim 1, wherein the crystal has electrodes on the (-110) faces, a $k_{15}$ of about 90%, a shear piezoelectric coefficient $d_{15}$ of about 3000 pC/N, and has a substantially stable coercive field of about 5 kV/cm with an internal bias field of about 1 kV/cm such that the allowable AC field drive level is about 40% of the coercive field.

5. The crystal of claim 1, wherein the crystal is doped with between 0.2 mol % to about 8 mol % of a dopant selected from the group consisting of manganese, iron, cobalt, nickel, aluminum, gallium, copper, potassium sodium, fluorides, and combinations thereof.

6. The crystal of claim 5, wherein the crystal is doped with between about 1 mol % to about 3 mol % of the dopant.

7. The crystal of claim 5, wherein the crystal is doped with about 1.5 mol % manganese.

8. The crystal of claim 5, wherein the crystal has electrodes on the (001) faces, a $k_{24}$ of about 85%, and a shear piezoelectric coefficient $d_{24}$ of about 2000 pC/N, the shear piezoelectric coefficient being substantially temperature stable in the temperature range of about -50° C. to about T$_{OT}$, where T$_{OT}$ is the orthorhombic to tetragonal phase transition temperature.

9. The crystal of claim 5, wherein the crystal has electrodes on the (-110) faces, a $k_{15}$ of about 90%, a shear piezoelectric coefficient $d_{15}$ of about 3000 pC/N, and has a coercive field of about 7 to about 9 kV/cm with an internal bias field of about 1 kV/cm, the allowable AC field drive level being about 60-70% of the coercive field.

10. The crystal of claim 5, wherein the crystal has electrodes on the (-110) faces and a shear piezoelectric coefficient $d_{16}$ of about 0.

11. The crystal of claim 1, wherein the crystal has electrodes on the (-110) faces and a shear piezoelectric coefficient $d_{16}$ of about 0.

* * * * *

UNITED STATES PATENT AND TRADEMARK OFFICE
CERTIFICATE OF CORRECTION

PATENT NO.         : 9,673,380 B2                                   Page 1 of 1
APPLICATION NO.    : 14/551513
DATED              : June 6, 2017
INVENTOR(S)        : Hackenberger et al.

It is certified that error appears in the above-identified patent and that said Letters Patent is hereby corrected as shown below:

In the Specification

In Column 1, Lines 20-23, please replace:
--Portions of the invention disclosed herein were reduced to practice with the support of the U.S. Office of Naval Research, Contract No. N00014-07-C-0858. The U.S. Government may have certain rights in this invention.--

With:
--This invention was made with government support under Grant Nos. N00014-09-1-0456 and N00014-07-C-0858, awarded by the Office of Naval Research. The Government has certain rights in the invention.--

Signed and Sealed this
First Day of August, 2017

Joseph Matal
*Performing the Functions and Duties of the*
*Under Secretary of Commerce for Intellectual Property and*
*Director of the United States Patent and Trademark Office*